United States Patent
Winterbottom et al.

(10) Patent No.: US 12,443,000 B2
(45) Date of Patent: Oct. 14, 2025

(54) OPTICALLY BRIDGED MULTICOMPONENT PACKAGE WITH EXTENDED TEMPERATURE RANGE

(71) Applicant: Celestial AI Inc., Santa Clara, CA (US)

(72) Inventors: Philip Winterbottom, San Jose, CA (US); David Lazovsky, Los Gatos, CA (US); Ankur Aggarwal, Pleasanton, CA (US); Martinus Bos, San Jose, CA (US); Subal Sahni, La Jolla, CA (US)

(73) Assignee: Celestial AI Inc., Santa Clara, CA (US)

( * ) Notice: Subject to any disclaimer, the term of this patent is extended or adjusted under 35 U.S.C. 154(b) by 0 days.

(21) Appl. No.: 19/170,617

(22) Filed: Apr. 4, 2025

(65) Prior Publication Data
US 2025/0258394 A1   Aug. 14, 2025

Related U.S. Application Data

(60) Division of application No. 18/742,028, filed on Jun. 13, 2024, now Pat. No. 12,298,608, which is a
(Continued)

(51) Int. Cl.
| | |
|---|---|
| *G02F 1/01* | (2006.01) |
| *G01K 7/02* | (2021.01) |
| *G01K 7/14* | (2006.01) |

(52) U.S. Cl.
CPC ........... *G02F 1/0123* (2013.01); *G01K 7/023* (2013.01); *G01K 7/028* (2013.01); *G01K 7/14* (2013.01); *G02F 1/0113* (2021.01)

(58) Field of Classification Search
CPC ....... G02F 1/0123; G02F 1/0113; G01K 7/14; G01K 7/028; G01K 7/023
See application file for complete search history.

(56) References Cited

U.S. PATENT DOCUMENTS

| | | |
|---|---|---|
| 4,912,706 A | 3/1990 | Eisenberg et al. |
| 4,934,775 A | 6/1990 | Koai |
| (Continued) | | |

FOREIGN PATENT DOCUMENTS

| | | |
|---|---|---|
| AU | 2019100030 A4 | 2/2019 |
| AU | 2019100679 A4 | 8/2019 |
| (Continued) | | |

OTHER PUBLICATIONS

Agrawal, Govind; "Chapter 4—Optical Receivers", Fiber-Optic Communications Systems, John Wiley & Sons, Inc., (2002), pp. 133-182.

(Continued)

*Primary Examiner* — Ryan A Lepisto
(74) *Attorney, Agent, or Firm* — John Maldjian, Esq.; Stevens & Lee PC

(57) ABSTRACT

A package comprises a photonic integrated circuit (PIC) with a modulator having a first modulator input, and a PIC interconnect region within two millimeters or fifty microns from the modulator. Additionally, an electric integrated circuit (EIC) is included with a driver circuit and an EIC interconnect region within two millimeters or fifty microns from the driver circuit. The driver circuit is electrically connected to the first modulator input via the EIC interconnect region, a first metal interconnect, and the PIC interconnect region. The modulator receives a temperature-dependent bias voltage, where the temperature dependence of the bias voltage inversely matches the temperature dependence of the modulator across an extended temperature range.

21 Claims, 28 Drawing Sheets

Related U.S. Application Data division of application No. 18/243,474, filed on Sep. 7, 2023, now Pat. No. 12,124,095, which is a continuation of application No. 18/123,083, filed on Mar. 17, 2023, now Pat. No. 11,835,777.

(60) Provisional application No. 63/448,585, filed on Feb. 27, 2023, provisional application No. 63/420,330, filed on Oct. 28, 2022, provisional application No. 63/321,453, filed on Mar. 18, 2022.

(56) References Cited

U.S. PATENT DOCUMENTS

| | | | |
|---|---|---|---|
| 5,457,563 A | 10/1995 | Van Deventer | |
| 6,249,621 B1 | 6/2001 | Sargent et al. | |
| 6,684,007 B2 | 1/2004 | Yoshimura et al. | |
| 6,714,552 B1 | 3/2004 | Cotter | |
| 7,034,641 B1 | 4/2006 | Clarke et al. | |
| 7,369,726 B2 * | 5/2008 | Drost | H01L 23/48 398/164 |
| 7,532,785 B1 | 5/2009 | Beausoleil et al. | |
| 7,570,844 B2 | 8/2009 | Handelman | |
| 7,778,501 B2 | 8/2010 | Beausoleil et al. | |
| 7,865,084 B2 * | 1/2011 | Krishnamoorthy | H01L 25/0657 398/140 |
| 7,889,996 B2 * | 2/2011 | Zheng | H04Q 11/0062 398/67 |
| 7,894,699 B2 | 2/2011 | Beausoleil | |
| 7,961,990 B2 | 6/2011 | Krishnamoorthy et al. | |
| 8,059,443 B2 | 11/2011 | Mclaren et al. | |
| 8,064,739 B2 | 11/2011 | Binkert et al. | |
| 8,212,354 B2 * | 7/2012 | Krishnamoorthy | H01L 24/72 257/723 |
| 8,213,751 B1 | 7/2012 | Ho et al. | |
| 8,260,147 B2 | 9/2012 | Scandurra et al. | |
| 8,285,140 B2 | 10/2012 | Mccracken et al. | |
| 8,288,854 B2 | 10/2012 | Weng et al. | |
| 8,326,148 B2 | 12/2012 | Bergman et al. | |
| 8,340,517 B2 | 12/2012 | Shacham et al. | |
| 8,447,146 B2 | 5/2013 | Beausoleil et al. | |
| 8,611,747 B1 | 12/2013 | Wach | |
| 8,831,437 B2 | 9/2014 | Dobbelaere et al. | |
| 8,971,676 B1 | 3/2015 | Thacker et al. | |
| 9,036,482 B2 | 5/2015 | Lea | |
| 9,250,403 B2 | 2/2016 | Thacker et al. | |
| 9,331,096 B2 | 5/2016 | Pinguet et al. | |
| 9,354,039 B2 | 5/2016 | Mower et al. | |
| 9,369,784 B2 | 6/2016 | Zid et al. | |
| 9,383,526 B2 | 7/2016 | Hu et al. | |
| 9,391,708 B2 | 7/2016 | Fincato et al. | |
| 9,443,824 B1 | 9/2016 | We et al. | |
| 9,495,295 B1 | 11/2016 | Dutt et al. | |
| 9,500,821 B2 | 11/2016 | Hochberg et al. | |
| 9,557,478 B2 | 1/2017 | Doerr et al. | |
| 9,570,883 B2 | 2/2017 | Zarbock et al. | |
| 9,615,751 B2 | 4/2017 | Fukutani et al. | |
| 9,651,751 B1 | 5/2017 | Ding | |
| 9,791,761 B1 | 10/2017 | Li et al. | |
| 9,829,626 B2 | 11/2017 | Shubin et al. | |
| 9,831,360 B2 | 11/2017 | Knights et al. | |
| 9,882,655 B2 | 1/2018 | Li et al. | |
| 10,026,723 B2 | 7/2018 | Evans et al. | |
| 10,031,287 B1 | 7/2018 | Heroux et al. | |
| 10,107,959 B2 | 10/2018 | Heroux et al. | |
| 10,117,007 B2 | 10/2018 | Song et al. | |
| 10,185,085 B2 | 1/2019 | Huangfu et al. | |
| 10,225,632 B1 | 3/2019 | Dupuis et al. | |
| 10,250,958 B2 | 4/2019 | Chen et al. | |
| 10,281,747 B2 | 5/2019 | Padmaraju et al. | |
| 10,365,445 B2 | 7/2019 | Badihi | |
| 10,520,672 B2 | 12/2019 | Ma et al. | |
| 10,564,512 B2 | 2/2020 | Sun et al. | |
| 10,598,852 B1 | 3/2020 | Zhao et al. | |
| 10,615,877 B2 | 4/2020 | Saad et al. | |
| 10,651,933 B1 | 5/2020 | Chiang et al. | |
| 10,742,217 B2 * | 8/2020 | Dabral | H01L 25/0652 |
| 10,768,659 B2 | 9/2020 | Carolan et al. | |
| 10,784,202 B2 | 9/2020 | Arguin et al. | |
| 10,837,827 B2 | 11/2020 | Nahmias et al. | |
| 10,872,854 B2 | 12/2020 | Raghunathan et al. | |
| 10,908,369 B1 | 2/2021 | Mahdi Hayder et al. | |
| 10,915,297 B1 | 2/2021 | Halutz et al. | |
| 10,935,722 B1 | 3/2021 | Li et al. | |
| 10,951,325 B1 | 3/2021 | Rathinasamy et al. | |
| 10,962,728 B2 | 3/2021 | Nelson et al. | |
| 10,976,491 B2 | 4/2021 | Coolbaugh et al. | |
| 10,991,635 B2 * | 4/2021 | McHerron | H01L 23/13 |
| 11,023,377 B2 | 6/2021 | Kumar | |
| 11,036,002 B2 | 6/2021 | Harris et al. | |
| 11,105,988 B2 | 8/2021 | Liang et al. | |
| 11,107,770 B1 | 8/2021 | Ramalingam et al. | |
| 11,159,240 B1 | 10/2021 | Di Mola | |
| 11,165,509 B1 | 11/2021 | Nagarajan et al. | |
| 11,165,711 B2 | 11/2021 | Mehrvar et al. | |
| 11,209,598 B2 | 12/2021 | Janta-Polczynski | |
| 11,233,580 B2 | 1/2022 | Meade et al. | |
| 11,244,938 B2 | 2/2022 | Choi et al. | |
| 11,281,972 B2 | 3/2022 | Shen et al. | |
| 11,321,092 B1 | 5/2022 | Raikin et al. | |
| 11,327,259 B2 | 5/2022 | Li et al. | |
| 11,336,376 B1 | 5/2022 | Xie | |
| 11,373,088 B2 | 6/2022 | Bleiweiss et al. | |
| 11,398,871 B2 | 7/2022 | Bunandar et al. | |
| 11,493,689 B2 | 11/2022 | Yu | |
| 11,493,714 B1 | 11/2022 | Mendoza et al. | |
| 11,500,153 B2 | 11/2022 | Meade et al. | |
| 11,509,397 B2 | 11/2022 | Ma et al. | |
| 11,536,897 B1 | 12/2022 | Thompson et al. | |
| 11,569,173 B2 * | 1/2023 | Collins | H01L 23/48 |
| 11,621,223 B2 * | 4/2023 | Collins | H01L 23/538 257/734 |
| 11,709,657 B2 | 7/2023 | Paraiso et al. | |
| 11,762,155 B2 | 9/2023 | Patel et al. | |
| 11,769,710 B2 | 9/2023 | Refai-Ahmed et al. | |
| 11,817,903 B2 | 11/2023 | Pleros et al. | |
| 11,835,777 B2 | 12/2023 | Winterbottom et al. | |
| 12,124,095 B2 | 10/2024 | Winterbottom | |
| 12,216,318 B2 | 2/2025 | Winterbottom | |
| 12,242,122 B2 | 3/2025 | Winterbottom | |
| 12,259,575 B2 | 3/2025 | Winterbottom et al. | |
| 12,283,584 B2 | 4/2025 | Aggarwal | |
| 12,298,608 B1 | 5/2025 | Winterbottom | |
| 2004/0213229 A1 | 10/2004 | Chang et al. | |
| 2006/0095639 A1 * | 5/2006 | Guenin | H01L 25/0652 257/E25.011 |
| 2006/0159387 A1 | 7/2006 | Handelman | |
| 2006/0204247 A1 | 9/2006 | Murphy | |
| 2010/0059822 A1 | 3/2010 | Pinguet et al. | |
| 2010/0266295 A1 | 10/2010 | Zheng et al. | |
| 2011/0206379 A1 | 8/2011 | Budd et al. | |
| 2012/0020663 A1 | 1/2012 | Mclaren et al. | |
| 2012/0207426 A1 | 8/2012 | Doany et al. | |
| 2012/0251116 A1 | 10/2012 | Li et al. | |
| 2013/0230272 A1 | 9/2013 | Raj et al. | |
| 2013/0275703 A1 | 10/2013 | Schenfeld et al. | |
| 2013/0308942 A1 | 11/2013 | Ji et al. | |
| 2014/0203175 A1 | 7/2014 | Kobrinsky et al. | |
| 2015/0109024 A1 | 4/2015 | Abdelfattah et al. | |
| 2015/0295098 A1 | 10/2015 | Toda | |
| 2015/0341119 A1 | 11/2015 | Fincato et al. | |
| 2015/0354938 A1 | 12/2015 | Mower et al. | |
| 2016/0116688 A1 | 4/2016 | Hochberg et al. | |
| 2016/0131862 A1 | 5/2016 | Rickman et al. | |
| 2016/0216445 A1 | 7/2016 | Thacker et al. | |
| 2016/0344507 A1 | 11/2016 | Marquardt et al. | |
| 2017/0045697 A1 | 2/2017 | Hochberg et al. | |
| 2017/0115458 A1 | 4/2017 | Mekis et al. | |
| 2017/0194309 A1 | 7/2017 | Evans et al. | |
| 2017/0194310 A1 | 7/2017 | Evans et al. | |
| 2017/0207600 A1 | 7/2017 | Klamkin et al. | |
| 2017/0220352 A1 | 8/2017 | Woo et al. | |
| 2017/0237226 A1 | 8/2017 | Johnson et al. | |

(56) References Cited

U.S. PATENT DOCUMENTS

| | | |
|---|---|---|
| 2017/0261708 A1 | 9/2017 | Ding et al. |
| 2017/0285372 A1 | 10/2017 | Baba et al. |
| 2018/0107030 A1 | 4/2018 | Morton et al. |
| 2018/0260703 A1 | 9/2018 | Soljacic et al. |
| 2018/0275359 A1 | 9/2018 | Ding et al. |
| 2019/0026225 A1 | 1/2019 | Gu et al. |
| 2019/0049665 A1 | 2/2019 | Ma et al. |
| 2019/0067260 A1 | 2/2019 | Koyama et al. |
| 2019/0205737 A1 | 7/2019 | Bleiweiss et al. |
| 2019/0265408 A1 | 8/2019 | Ji et al. |
| 2019/0266088 A1 | 8/2019 | Kumar |
| 2019/0266089 A1 | 8/2019 | Kumar et al. |
| 2019/0287908 A1 | 9/2019 | Dogiamis et al. |
| 2019/0294199 A1 | 9/2019 | Carolan et al. |
| 2019/0317285 A1 | 10/2019 | Liff et al. |
| 2019/0317287 A1 | 10/2019 | Raghunathan et al. |
| 2019/0356394 A1 | 11/2019 | Bunandar et al. |
| 2019/0372589 A1 | 12/2019 | Gould et al. |
| 2019/0385997 A1 | 12/2019 | Choi et al. |
| 2020/0006235 A1 | 1/2020 | Aleksov et al. |
| 2020/0006304 A1 | 1/2020 | Chang et al. |
| 2020/0125716 A1 | 4/2020 | Chittamuru Sai et al. |
| 2020/0142441 A1 | 5/2020 | Bunandar et al. |
| 2020/0158967 A1 | 5/2020 | Winzer et al. |
| 2020/0174707 A1 | 6/2020 | Johnson |
| 2020/0200987 A1 | 6/2020 | Kim et al. |
| 2020/0209655 A1 | 7/2020 | Roth et al. |
| 2020/0213028 A1 | 7/2020 | Behringer et al. |
| 2020/0219865 A1 | 7/2020 | Nelson et al. |
| 2020/0250532 A1 | 8/2020 | Shen et al. |
| 2020/0284981 A1 | 9/2020 | Harris et al. |
| 2020/0310761 A1 | 10/2020 | Rossi et al. |
| 2020/0365544 A1 | 11/2020 | Chen et al. |
| 2020/0409001 A1 | 12/2020 | Liang et al. |
| 2020/0410330 A1 | 12/2020 | Liu et al. |
| 2021/0036783 A1 | 2/2021 | Bunandar et al. |
| 2021/0064958 A1 | 3/2021 | Lin et al. |
| 2021/0072784 A1 | 3/2021 | Lin et al. |
| 2021/0096311 A1 | 4/2021 | Yu et al. |
| 2021/0116637 A1 | 4/2021 | Li et al. |
| 2021/0132309 A1 | 5/2021 | Zhang et al. |
| 2021/0132650 A1 | 5/2021 | Lin et al. |
| 2021/0133547 A1 | 5/2021 | Lin et al. |
| 2021/0173238 A1 | 6/2021 | Hosseinzadeh et al. |
| 2021/0257396 A1 | 8/2021 | Piggott et al. |
| 2021/0271020 A1 | 9/2021 | Islam et al. |
| 2021/0286129 A1 | 9/2021 | Fini et al. |
| 2021/0288035 A1 | 9/2021 | Liljeberg et al. |
| 2021/0305127 A1 | 9/2021 | Refai-Ahmed et al. |
| 2021/0320718 A1 | 10/2021 | Kalman et al. |
| 2021/0406164 A1 | 12/2021 | Grymel et al. |
| 2021/0409848 A1 | 12/2021 | Saunders et al. |
| 2022/0003948 A1 | 1/2022 | Zhou et al. |
| 2022/0004029 A1 | 1/2022 | Meng et al. |
| 2022/0012578 A1 | 1/2022 | Brady et al. |
| 2022/0012582 A1 | 1/2022 | Pleros et al. |
| 2022/0044092 A1 | 2/2022 | Pleros et al. |
| 2022/0045757 A1 | 2/2022 | Pleros et al. |
| 2022/0091332 A1 | 3/2022 | Yoo et al. |
| 2022/0092016 A1 | 3/2022 | Kumashikar et al. |
| 2022/0159860 A1 | 5/2022 | Winzer |
| 2022/0171142 A1 | 6/2022 | Wright et al. |
| 2022/0263582 A1 | 8/2022 | Ma et al. |
| 2022/0302033 A1 | 9/2022 | Cheah et al. |
| 2022/0342164 A1 | 10/2022 | Chen et al. |
| 2022/0374575 A1 | 11/2022 | Ramey et al. |
| 2022/0382005 A1 | 12/2022 | Rusu et al. |
| 2022/0404544 A1 | 12/2022 | Winterbottom et al. |
| 2022/0404545 A1 | 12/2022 | Winterbottom et al. |
| 2022/0405056 A1 | 12/2022 | Winterbottom et al. |
| 2022/0405562 A1 | 12/2022 | Winterbottom et al. |
| 2022/0405566 A1 | 12/2022 | Winterbottom et al. |
| 2023/0089415 A1 | 3/2023 | Zilkie et al. |
| 2023/0104033 A1 | 4/2023 | Pleros et al. |
| 2023/0106486 A1 | 4/2023 | Pleros et al. |
| 2023/0197699 A1 | 6/2023 | Spreitzer et al. |
| 2023/0251423 A1 | 8/2023 | Pérez et al. |
| 2023/0258886 A1 | 8/2023 | Liao et al. |
| 2023/0282547 A1 | 9/2023 | Refai-Ahmed et al. |
| 2023/0308188 A1 | 9/2023 | Dorta-Quinones et al. |
| 2023/0314702 A1 | 10/2023 | Yu et al. |
| 2023/0376818 A1 | 11/2023 | Nowak et al. |
| 2023/0393357 A1 | 12/2023 | Ranno et al. |
| 2024/0145328 A1 | 5/2024 | Sahni |

FOREIGN PATENT DOCUMENTS

| | | |
|---|---|---|
| AU | 2019100750 A4 | 8/2019 |
| CN | 102281478 A | 12/2011 |
| CN | 102333250 A | 1/2012 |
| CN | 102413039 A | 4/2012 |
| CN | 102638311 A | 8/2012 |
| CN | 102645706 A | 8/2012 |
| CN | 202522621 U | 11/2012 |
| CN | 103369415 A | 10/2013 |
| CN | 103442311 A | 12/2013 |
| CN | 103580890 A | 2/2014 |
| CN | 104539547 A | 4/2015 |
| CN | 105451103 A | 3/2016 |
| CN | 205354341 U | 6/2016 |
| CN | 105812063 A | 7/2016 |
| CN | 105847166 A | 8/2016 |
| CN | 106126471 A | 11/2016 |
| CN | 106331909 A | 1/2017 |
| CN | 106407154 A | 2/2017 |
| CN | 106533993 A | 3/2017 |
| CN | 106549874 A | 3/2017 |
| CN | 106796324 A | 5/2017 |
| CN | 106888050 A | 6/2017 |
| CN | 106911521 A | 6/2017 |
| CN | 106936708 A | 7/2017 |
| CN | 106936736 A | 7/2017 |
| CN | 106980160 A | 7/2017 |
| CN | 107911761 A | 4/2018 |
| CN | 108599850 A | 9/2018 |
| CN | 207835452 U | 9/2018 |
| CN | 108737011 A | 11/2018 |
| CN | 110266585 A | 9/2019 |
| CN | 110505021 A | 11/2019 |
| CN | 111208690 A | 5/2020 |
| CN | 111752891 A | 10/2020 |
| CN | 111770019 A | 10/2020 |
| CN | 111786911 A | 10/2020 |
| FR | 3007537 A1 | 12/2014 |
| GB | 2223867 A | 4/1990 |
| IN | 201621017235 A | 7/2016 |
| IN | 202121008267 A | 4/2021 |
| JP | 6747660 B | 8/2020 |
| JP | 2020155112 A | 9/2020 |
| KR | 101242172 B1 | 3/2013 |
| KR | 101382606 B1 | 4/2014 |
| KR | 101465420 B1 | 11/2014 |
| KR | 101465498 B1 | 11/2014 |
| KR | 101541534 B1 | 8/2015 |
| KR | 101548695 B1 | 9/2015 |
| KR | 101766786 B1 | 8/2017 |
| KR | 101766792 B1 | 8/2017 |
| TW | 201903449 A | 1/2019 |
| WO | 2015176289 A1 | 11/2015 |
| WO | 2020072925 A1 | 4/2020 |
| WO | 2020102204 A1 | 5/2020 |
| WO | 2020191217 A1 | 9/2020 |
| WO | 2021021787 A1 | 2/2021 |
| WO | 2022032105 A1 | 2/2022 |
| WO | 2022133490 A1 | 6/2022 |
| WO | 2022266676 A2 | 12/2022 |
| WO | 2023177417 A1 | 9/2023 |

(56) References Cited

FOREIGN PATENT DOCUMENTS

| WO | 2023177922 A2 | 9/2023 |
|---|---|---|
| WO | WO2023177848 A1 | 9/2023 |

OTHER PUBLICATIONS

Ardestani, et al., "Supporting Massive DLRM Inference Through Software Defined Memory", Nov. 8, 2021; 14 pages.
Burgwal, Roel et al.; "Using an imperfect photonic network to implement random unitaries," Opt. Express 25(23), (2017), 28236-28245.
Capmany, Francoy et al.; "Thepgrammable processor" Nature Photonics, 109/22/20226, (2016), 5 pgs.
Carolan, Jacques et al.; "Universal Linear Optics"; arXiv: 1505.01182v1 ; (2015); 13 pgs.
Clements, William et al.; "Optimal design for universal multiport interferometers"; Optiva; vol. 3, No. 12; (2016), pp. 1460-1465.
Eltes, Felix et al.; "A BaTiO3-Based Electro-Optic Pockets Modulator Monolithically Integrated on an Advanced Silicon Photonics Platform"; J. Lightwave Technol. Vol. 37, No. 5; (2019), pp. 1456-1462.
Eltes, Felix et al.; Low-Loss BaTiO3—Si Waveguides for Nonlinear Integrated Photonics; ACS Photon., vol. 3, No. 9; (2016), pp. 1698-1703.
Harris, NC et al.; "Efficient, compact and low loss thermo-optic phase shifter in colicon"; Opt. Express, vol. 22, No. 9; (2014), pp. 10487-10493.
International Search Report and Written Opinion mailed Jun. 7, 2023, issued in connection with corresponding International Patent Application No. PCT/US23/15467 (9 pages total).
Jiang, W.; "Nonvolatile and ultra-low-loss reconfigurable mode (De) multiplexer/switch using triple-waveguide coupler with Ge2Sb2Se4T31 phase change material"; Sci. Rep. Vol. 8, No. 1; (2018), 12 pages.
Lambrecht, Joris et al.; "90-GB/s NRZ Optical Receiveer in Silicon Using a Fully Differential Transimpedance Aplifier," Journal of Lightwave Technology, vol. 37, No. 9; (2019); pp. 1964-1973.
Manolis, A. et al.; "Non-volatile integrated photonic memory using GST phase change material on a fully eched Si3N4/SiO2 waveguide"; Conference on Lasers and Electro-optics; OSA Technical Digest, paper STh3R.4; (2020); 2 pages.
Miller David A. et al; "Perfect optics with imperfect components"; Optica, vol. 2, No. 8; (2015); pp. 747-750.
Miller, David A. et al.; "Self-Configuring Universal Linear Optical Component"; Photon. Res. 1; [Online]; Retrieved from the interent: URL: https://arxiv.org/ftp/arxiv/papers/1303/1303.4602.pdf; (2013), pp. 1-15.
Miscuglio, Mario et al.; "Photonic Tensor cores for machine learning"; Applied Physics Reviews, vol. 7, Issue 3; (2020), 16 pages.
Mourgias-Alexandris, George et al; "An all-optical neuron with sigmoid activation function;" Optics Express, vol. 27, No. 7; (2019), pp. 9620-9630.
Mourgias-Alexandris, George et al; Neuromorphic Photonics with Coherent Linear Neurons Using Dual-IQ Modulation Cells, Journal of Lightwave Technology, vol. 38, No. 4; Feb. 15, 2020, pp. 811-819.
Pai, Sunil et al.; "Parallel Programming of an Arbitrary Feedforward Photonic Network"; IEEE Journal of Selected Topics in Quantum Electronics, vol. 26, No. 5; (2020), 13 pages.
Perez, Daniel et al. "Reconfigurable lattice mesh designs for prgrammable photonic processors"; Optics Express vol. 24, Issue 11; (2016); pp. 12093-12106.
Raj, Mayank et al.; "Design of a 50-GB/s Hybrid Integrated Si-Photonic Optical Link in 16-nm FinFET"; IEEE Journal of Solid-State Circuits, vol. 55, No. 4, Apr. 2020, pp. 1086-1095.
Reck, M. et al.; "Experimental Realization of any Discrete Unitary Operator"; Phys. Rev. Lett. 73; (1994); pp. 58-61.
Shen, Yichen et al.; "Deep learning with coherent nanophotonic circuits"; https://arxiv.org/pdf/1610.02365.pdf; (2016); 8 pages.
Shi, Bin et al.; Numerical Simulation of an InP Photonic Integrated Cross-Connect for Deep Neural Networks on Chip; Applied Sciences, Jan. 9, 2020, pp. 1-15.
Shokraneh, Farhad et al; "The diamond mesh, a phase-error- and loss-tolerant fieldprogrammable MZI-based optical processor for optical neural networks" Opt. Express, vol. 28, No. 16; (2020); pp. 23495-23508.
Sun, Chen et al; "A 45 nm cmos-soi monolithic photonics platform with bit-statistics-based resonant microring thermal tuning"; IEEE Journal of Solid-State Circuits, vol. 51, No. 4; (2016); 20 pages.
Tait, Alexander et al; "Broadcast and Weight: An Intergated Network for Scalable Photonic Spike Processing"; Journal of Lightwave Technology, vol. 32, No. 21; (2014); pp. 4029-4041.
Yang, Lin et al; "On-chip CMOS-compatible optical signal processor"; Opt. Express, vol. 20, No. 12; (2012) pp. 13560-13565.
Zhuang, L. et al; Programmable photonic signal processor chip for radiofrequency applications; Optica 2; 854-859; (2015); 10 pages.
Wu, et al., "Design of a broadband Ge1-xSix electro-absorption modulator based on the Franz-Keldysh effect with thermal tuning," Opt. Express 28, 7585-7595 (2020) (11 pages total).
International Preliminary Report on Patentabiity mailed Jul. 8, 2024, issued in connection with corresponding International Patent Application No. PCT/US23/15467 (13 pages total).
Hendry, G. et al., "Circuit-Switched Memory Access in Photonic Interconnection Networks for High-Performance Embedded Computing," SC '10: Proceedings of the 2010 ACM/IEEE International Conference for High Performance Computing, Networking, Storage and Analysis, New Orleans, LA, USA, 2010, pp. 1-12, (Year: 2010).
Liu, Jifeng, et al., "Waveguide-integrated, ultralow-energy GeSi electro-absorption modulators," Nature Photonics, [online] vol. 2, No. 7, May 30, 2008 (May 30, 2008). pp. 433-437.
Wu, Longsheng et al., "Design of a broadband Ge1-XSix electro-absorption modulator based on the Franz-Keldysh effect with thermal tuning," Optics Express, [online] vol. 28, No. 5, Feb. 27, 2020 (Feb. 27, 2020), p. 7585.
Zhang, Yulong, "Building blocks of a silicon photonic integrated wavelength division multplexing transmitter for detector instrumentaion," Doktors Der Ingenieurwissenschaften (Dr.-ing.), Dec. 15, 2020 (Dec. 15, 2020), 128 pages.
Dakkak, A.D. et al., "Accelerating Reduction and Scan Using Tenso Core Units," 2019 ACM, pp. 46-.47.
Taiwan Office action and Search Report mailed Nov. 13, 2024, issued in connection with corresponding Taiwanese patent application No. 112110099 (5 pages total).

\* cited by examiner

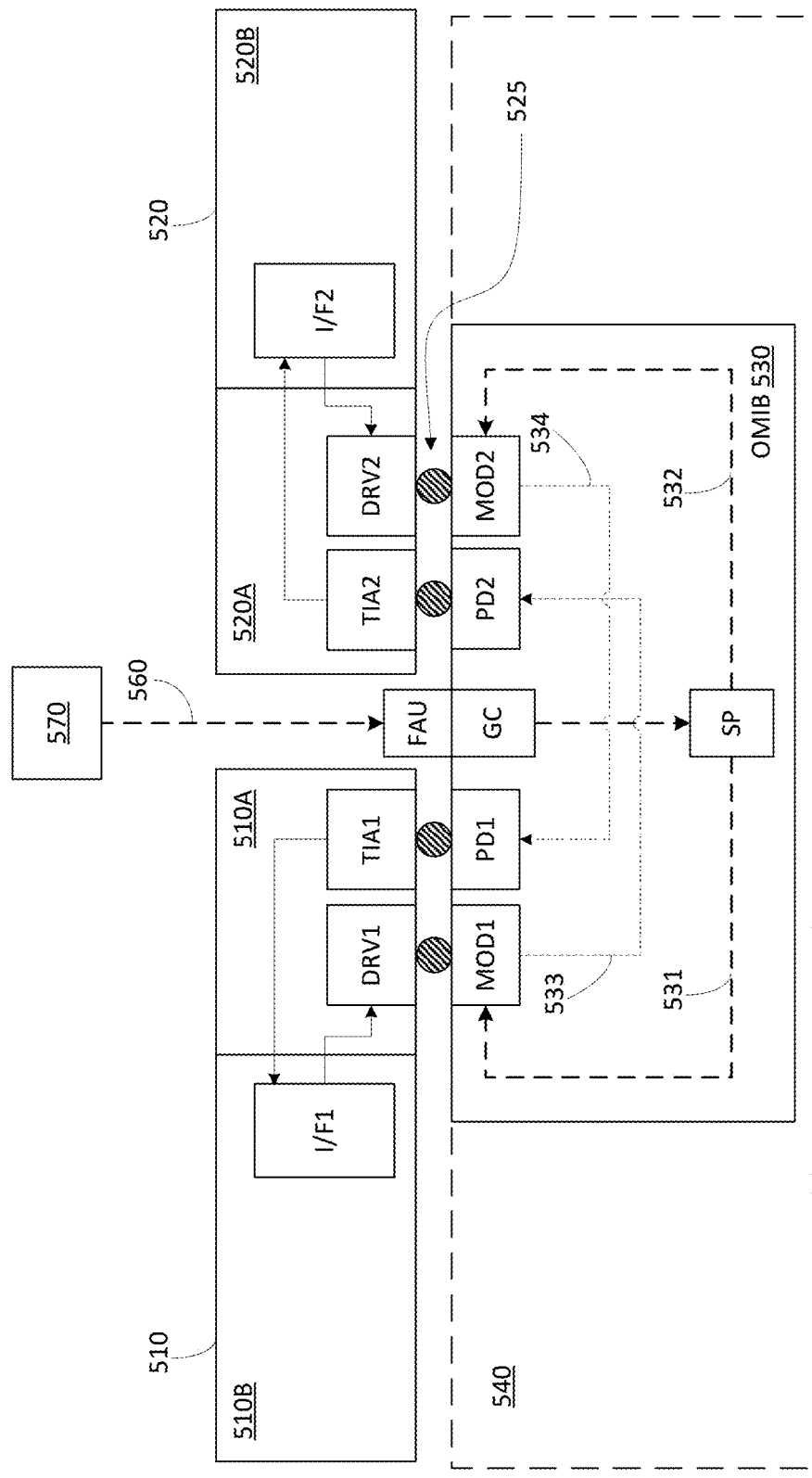
FIG. 5A (INTRA-OMIB)

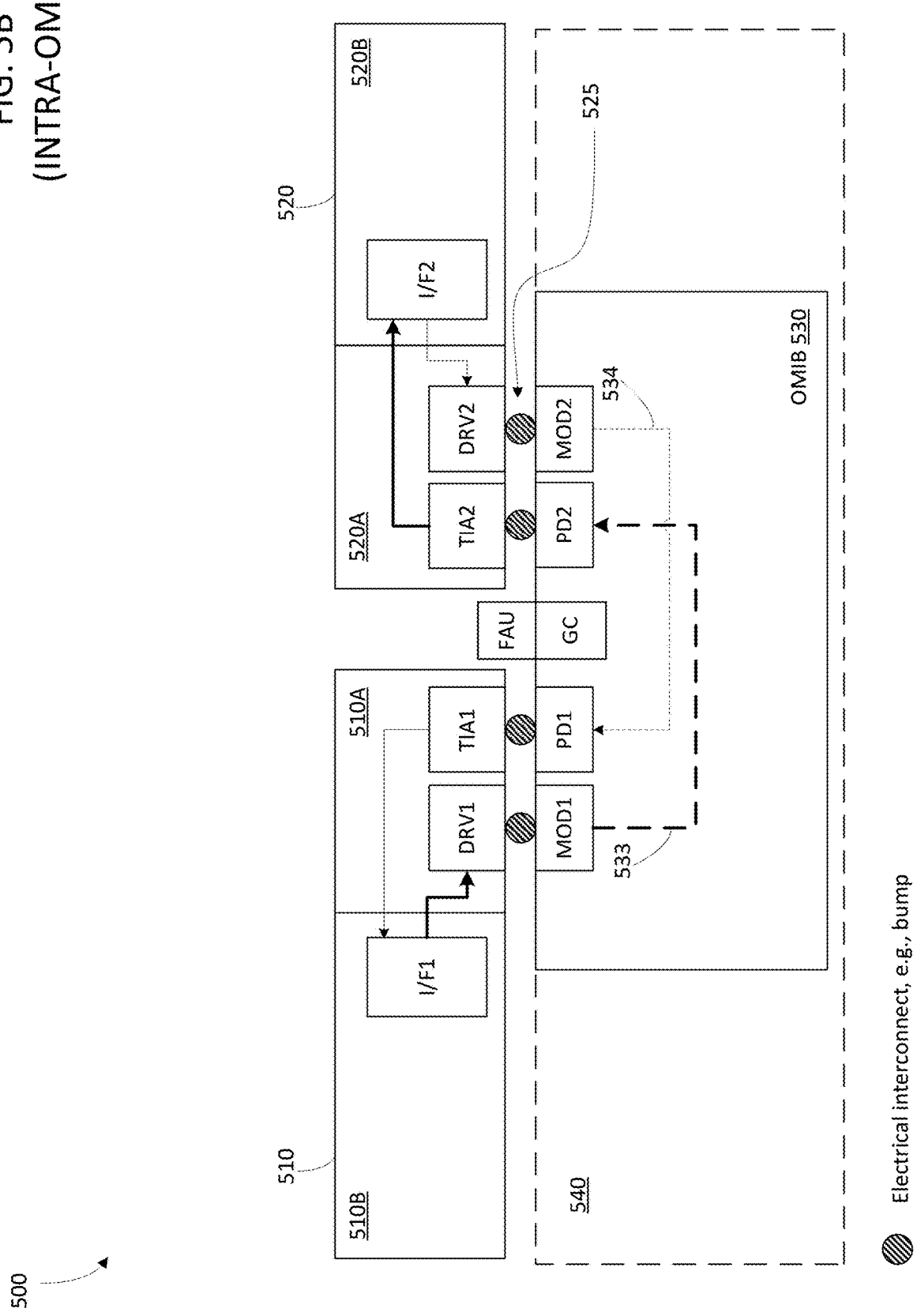
FIG. 5B (INTRA-OMIB)

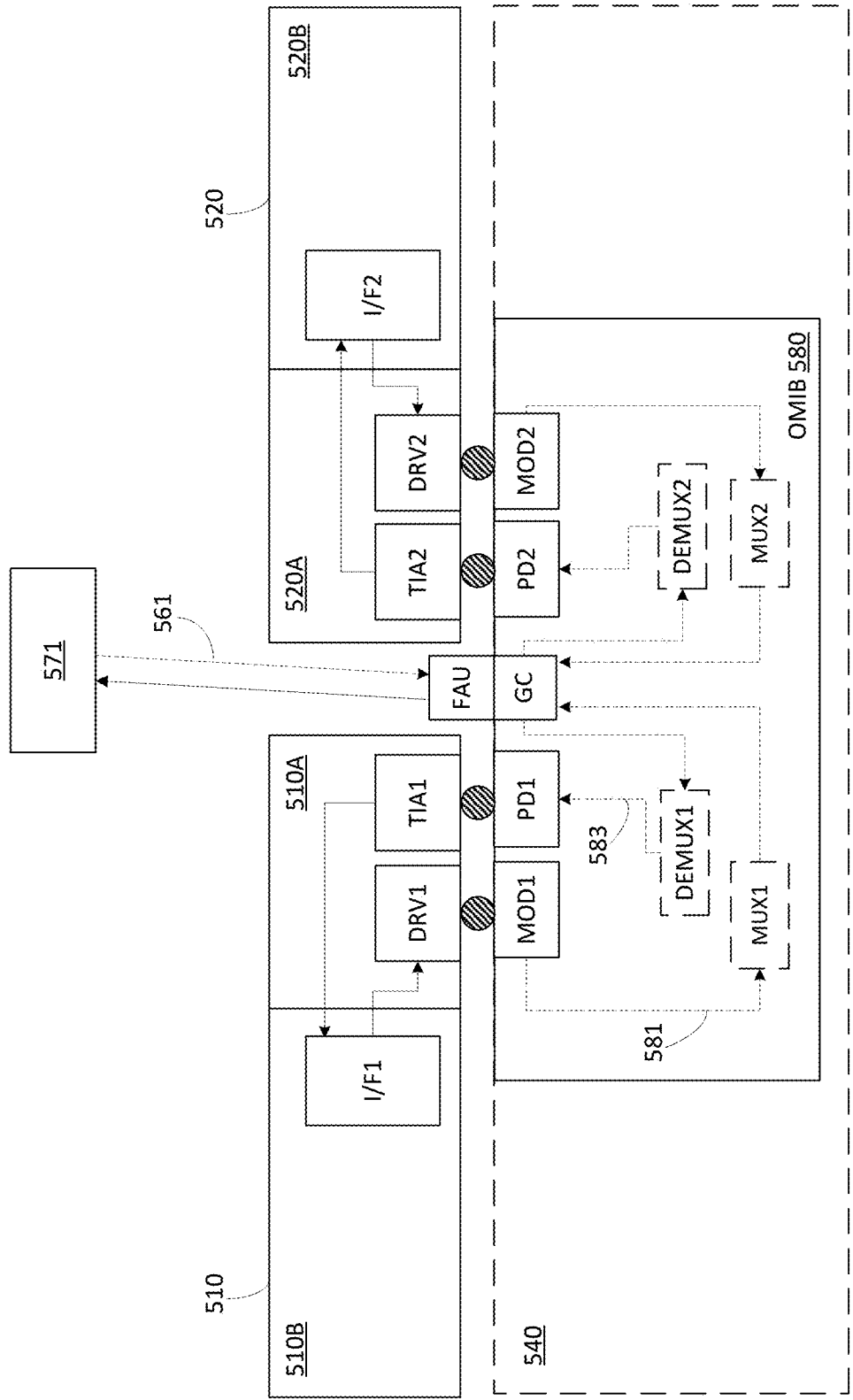
FIG. 5C (INTER-OMIB)

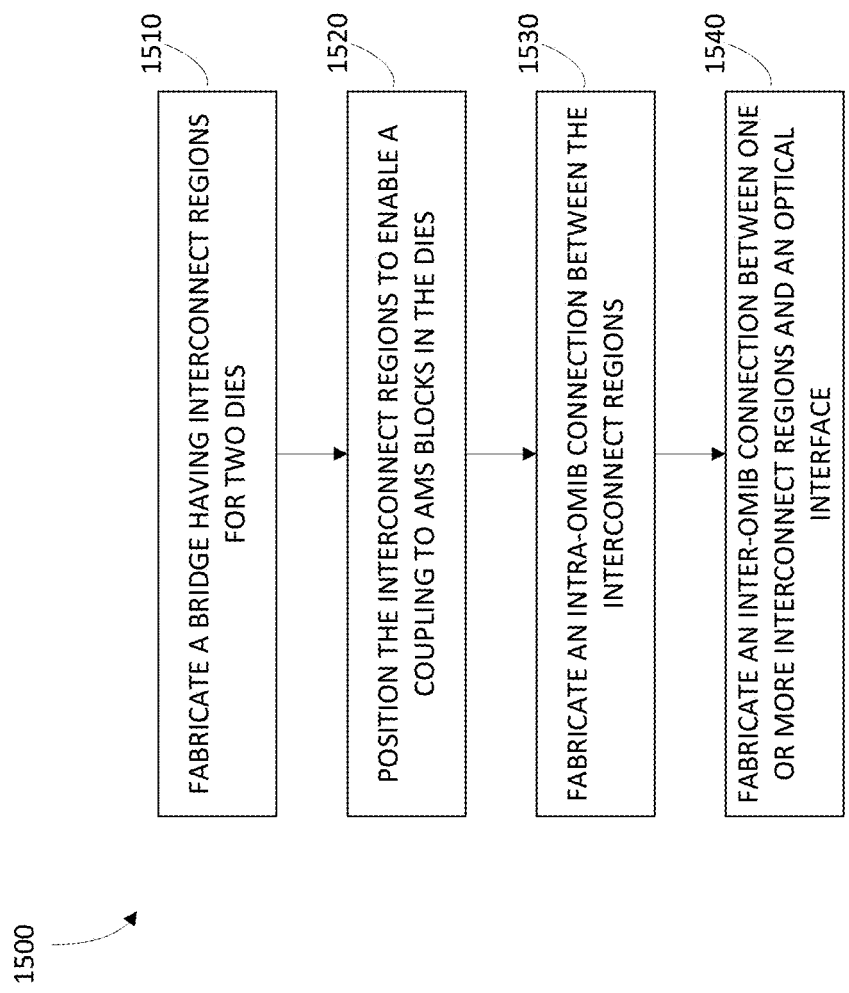

1810 — FABRICATE A SYSTEM INCLUDING A FIRST DIE, A SECOND DIE, AN OMIB, A LIGHT SOURCE, AND A DATA CHANNEL

- BONDPAD PATTERNS ON OMIB MATCH BONDPAD PATTERNS OF FIRST DIE AND SECOND DIE
- FIRST DIE AND SECOND DIE COUPLE WITH THE OMIB VIA BONDPADS IN THE MATCHING BONDPAD PATTERNS
- THE LIGHT SOURCE COUPLES WITH THE OMIB VIA AN OI IN THE OFFSET REGION
- THE DATA CHANNEL INCLUDES SERIALIZER AND DRIVER IN FIRST DIE, MODULATOR, PATH AND PD IN OMIB, AND TIA AND DESERIALIZER IN SECOND DIE
- DISTANCE BETWEEN FIRST DIE AND OMIB IS LESS THAN 2MM
- DISTANCE BETWEEN SECOND DIE AND OMIB IS LESS THAN 2 MM

OPTICALLY BRIDGED MULTICOMPONENT PACKAGE WITH EXTENDED TEMPERATURE RANGE

CROSS REFERENCE TO RELATED APPLICATIONS

This application is a divisional of U.S. patent application Ser. No. 18/742,028, entitled "Optically Bridged Multicomponent Package with Extended Temperature Range", filed on Jun. 13, 2024; which is a divisional of U.S. patent application Ser. No. 18/243,474, entitled "OPTICAL MULTI-DIE INTERCONNECT BRIDGE WITH OPTICAL INTERFACE", filed on Sep. 7, 2023, now U.S. Pat. No. 12,124,095; which is a continuation of U.S. patent application Ser. No. 18/123,083, entitled "OPTICAL MULTI-DIE INTERCONNECT BRIDGE (OMIB)", filed on Mar. 17, 2023, now U.S. Pat. No. 11,835,777; which claims benefit and priority to U.S. provisional patent application No. 63/448,585, entitled "Optical, Multi-Die Interconnect Bridge (OMIB)", filed on Feb. 27, 2023, and U.S. provisional patent application No. 63/321,453, entitled "Photonic Memory Fabric for System Memory Interconnection", filed on Mar. 18, 2022, and U.S. provisional patent application No. 63/420,330, entitled "Thermally Stable Optical Modulation Elements Coupled to Electronic Elements", filed on Oct. 28, 2022. This application is also a continuation of U.S. patent application Ser. No. 19/070,348, entitled "Multi-Chip Electro-Photonic Networks and Photonic Memory Fabrics for Interconnecting Multiple Circuit Packages", filed Mar. 4, 2025, which is a continuation of Ser. No. 17/903,455, entitled "Multi-Chip Electro-Photonic Networks and Photonic Memory Fabrics for Interconnecting Multiple Circuit Packages", filed Mar. 4, 2025, which claims benefit and priority to U.S. provisional patent application Ser. No. 63/321,453, entitled "Photonic Memory Fabric for System Memory Interconnection", filed on Mar. 18, 2022. This application is related to U.S. patent application Ser. No. 17/807,694, filed on Jun. 17, 2022, and U.S. patent application Ser. No. 18/293,673, filed Jan. 30, 2024, and U.S. patent application Ser. No. 18/123,161, filed Mar. 17, 2023, and U.S. patent application Ser. No. 18/123,170, filed Mar. 17, 2023, International Patent Application No. PCT/US23/15680, filed Mar. 20, 2023, and International Patent Application No. PCT/US22/42621, filed Sep. 6, 2022.

These priority applications are hereby incorporated by reference, in their entirety.

BACKGROUND

Technical Field

The disclosed implementations relate generally to devices and methods used in interconnecting semiconductor dies, and in particular to those for optical interconnection using integrated circuits and/or external chiplets.

Context

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Integrated circuits (ICs) with processors, especially those for executing artificial intelligence and machine learning functions, move large amounts of data among one or more processor ICs and one or more memory ICs. Chiplets may aid in the interconnection of processor dies, memory dies, and other circuits to increase the bandwidth, and decrease the latency and power dissipated in the process.

SUMMARY

In some aspects, the techniques described herein relate to a package including: a photonic IC (PIC 1720, 1740, 1760, 1780) including: a modulator (MOD 1721, 1741, 1761, 1781) with a first modulator input; and a PIC interconnect region located within two millimeters (2 mm) from the modulator; and an electric IC (EIC 1710, 1730, 1750, 1770) including: a driver circuit (DRV 1711, 1731, 1751, 1771); and an EIC interconnect region located within two millimeters (2 mm) from the driver circuit. In some cases, the PIC interconnect region is located within fifty microns (50 μm) from the modulator and the EIC interconnect region is located within fifty microns (50 μm) from the driver circuit. The driver circuit is electrically coupled with the first modulator input via the EIC interconnect region, a first metal interconnect, and the PIC interconnect region. The modulator is configured to receive a temperature-dependent bias voltage. The temperature dependence of the temperature-dependent bias voltage inversely matches the temperature dependence of the modulator over an extended temperature range.

A further understanding of the nature and the advantages of particular implementations disclosed herein may be realized by reference of the remaining portions of the specification and the attached drawings.

BRIEF DESCRIPTION OF THE DRAWINGS

The invention will be described with reference to the drawings, in which:

FIGS. 5A-5E show example packages that use a light engine to provide an optical signal for use by the photonic network.

FIG. 15 is a flowchart showing example method of fabricating an OMIB according to various implementations.

FIG. 18 illustrates an example method 1800 of fabricating a system.

Figure 1:
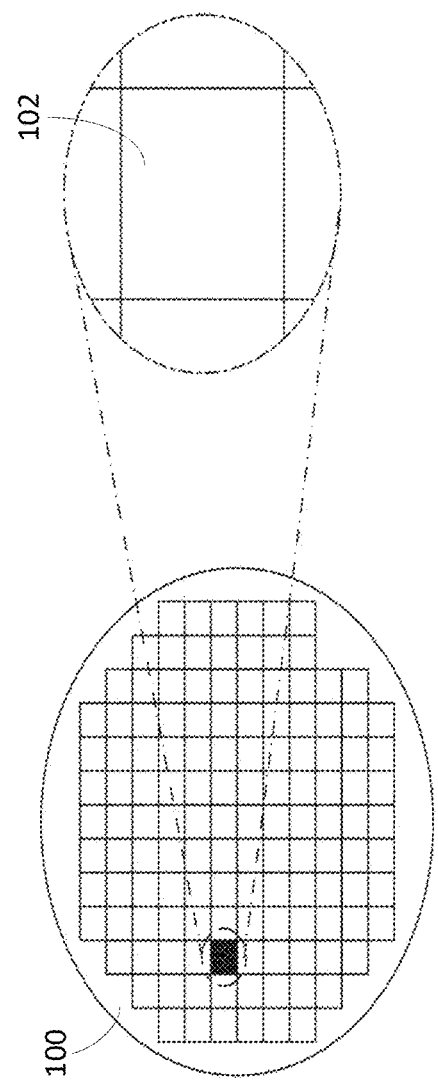
FIG. 1 is a top view of a wafer and a die that may include, or be included in, one or more microelectronic packages with an OMIB, in accordance with various implementations.

In the figures, like reference numbers may indicate functionally similar elements. The systems and methods illustrated in the figures, and described in the Detailed Description below, may be arranged and designed in a wide variety of different implementations. Neither the figures nor the Detailed Description are intended to limit the scope as claimed. Instead, they merely represent examples of different implementations of the invention.

DETAILED DESCRIPTION

Processing an AI workload often uses specialized hardware. Typical hardware bridges two chips with an electrical interconnect. The electrical interconnect consumes high power, has pin count limitations, and can only bring data to the edge of the chip. When the memory is in a central region of the chip it requires extra distance for signals to travel every time the memory is accessed by a processor sending a request to the edge of the chip from outside the chip. This is highly inefficient and makes it difficult for AI computing hardware to keep up with the demands required by an AI application.

This document discloses an optical multi-die interconnect bridging element (OMIB). OMIBs can be used as bridges between semiconductor dies, e.g., electrical integrated circuits (EICs). A bridge can include the OMIB alone, or in combination with a substrate that is coupled to the OMIB or that has the OMIB embedded within it. The use of OMIBs for multi-die processing systems solves many of the problems associated with processing an AI workload, including latency, power, and bandwidth. A photonic receiver may comprise two portions, for example a first portion in the OMIB, including a modulator and/or a photodetector, and a second portion in the EIC, including an AMS block as described later herein.

In various arrangements, the OMIB can transmit or receive a photonic signal to transport data. A memory, such as a cache, can be positioned at a central region of the EIC die within two millimeters (2 mm) from an AMS block, such that the photonic transceiver in the OMIB is proximate to an edge of the memory directly above or below the portion of the die where the edge of the memory is positioned. The central region may intersect the center of the EIC die. Compute elements such as central processing units (CPUs), graphic processing units (GPUs), tensor processing units (TPUs) can also be beneficially arranged at the central region of the die within two millimeters (2 mm) of where the photonic transceivers are positioned, or in a spatial association with the memory. Photonic ICs have avoided reaching the center of the die of connecting chips because of the heat produced by the connecting chips. Photonic chips may have a limited temperature range in which modulators perform within specifications. One reason an OMIB in the disclosed technology can reach the center of the die is that it uses temperature-stabilized modulators as described in U.S. provisional patent application Ser. No. 63/420,330, entitled "Thermally Stable Optical Modulation Elements Coupled to Electronic Elements."

As a result, the OMIB is faster and uses less power when compared to a traditional system. Latency is improved by carrying the data photonically to the point of compute rather than to the edge of the die. This allows the die to save electrical pipeline stages and also utilizes less electrical connections to carry the data from the edge of the chip to the interior where the memory is located. The electrical movement of the data from the edge of the die to the interior requires a path for the data that is slower and more power hungry. If an exemplary system is used to train an AI model, the benefit of moving the data photonically to the point of compute is repeated continuously, resulting in substantial savings and/or enabling the feasibility of these types of complex AI systems.

Terminology

The description may use perspective-based descriptions such as top/bottom, in/out, over/under, and the like. Such descriptions are merely used to facilitate the discussion and are not intended to restrict the application of implementations described herein to any particular orientation.

As used herein, the phrase "one of" should be interpreted to mean exactly one of the listed items. For example, the phrase "one of A, B, and C" should be interpreted to mean any of: only A, only B, or only C.

As used herein, the phrases "at least one of" and "one or more of" should be interpreted to mean one or more items. For example, the phrase "at least one of A, B, and C" or the phrase "at least one of A, B, or C" should be interpreted to mean any combination of A, B, and/or C.

Unless otherwise specified, the use of ordinal adjectives "first", "second", "third", etc., to describe an object, merely refers to different instances or classes of the object and does not imply any ranking or sequence.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases, the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetic, or mechanical, between the things that are connected, without any intervening things or devices.

The term "configured to" perform a task or tasks is a broad recitation of structure generally meaning "having circuitry that" performs the task or tasks during operation. As such, the described item can be configured to perform the task even when the unit/circuit/component is not currently on or active. In general, the circuitry that forms the structure corresponding to "configured to" may include hardware circuits, and may further be controlled by switches, fuses, bond wires, metal masks, firmware, and/or software. Similarly, various items may be described as performing a task or tasks, for convenience in the description. Such descriptions should be interpreted as including the phrase "configured to."

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase "based on" is thus synonymous with the phrase "based at least in part on."

A "processor" includes any suitable hardware system, mechanism or component that processes data, signals or other information. A processor can include a system with a general-purpose central processing unit, multiple processing units, dedicated circuitry for achieving functionality, or other systems. Examples of processing systems can include servers, clients, end user devices, routers, switches, networked storage, etc. A "computer" may be any processor in communication with a memory. The memory may be any suitable processor-readable storage medium, such as random-access memory (RAM), read-only memory (ROM), magnetic or optical disk, or other tangible media suitable for storing instructions for execution by the processor.

The terms "substantially", "close", approximately", "near", and "about" refer to being within minus or plus 10% of an indicated value, unless explicitly specified otherwise.

The following terms or acronyms used herein are defined at least in part as follows:

AI—artificial intelligence
AMS—analog/mixed-signal
BGA—ball-grid array
A channel is one or more lanes that may be bonded together.
Chiplet—an integrated circuit with simple or specialized functionality to be used in combination with other ICs or chiplets in a multi-chip assembly.
CLE—chiplet light engine
CPU—central processing unit
CW—continuous wave
DDR memory—double-data rate memory
DFB—distributed fiber Bragg
DIMM—dual in-line memory module
DRV—driver. In some embodiments, the driver is a photonic-integrated circuit (PIC) or a electronic-integrated circuit (EIC).
DSP—digital signal processor
EAM—electro-absorption modulator
EIC—electronic integrated circuit
EW—evanescent wave
FAU—fiber array unit
FBG—fiber Bragg grating
FPGA—field-programmable gate array
GC—grating coupler—a coupling between an optical fiber and an on-chip photonic waveguide.
GPU—graphic processing unit
GRIN lens—graded index lens
HBM—high-bandwidth memory
IC—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.
A lane includes a serializer, a link, and a deserializer.
LED—light emitting diode
LDSU—load/store unit
A link in the context of this patent document is the combination of a modulator, a photonic path (in an optical transmission medium), and a photodetector.
LGA—land grid array
ML—machine learning
MLA—micro-lens array
MOD—modulator
MZI—Mach-Zehnder interferometer
OI—optical interface—an interface that uses any means for optical interfacing between a fiber and a photonic IC.
OMIB—optical multi-die interconnect bridge
PCB—printed circuit board
PCIe—PCI express—a high-speed serial computer expansion bus.
PCM—phase-change memory
PD—photo detector, for example a photo diode.
PGA—pin-grid array
PIC—photonic integrated circuit
QR—quick response
A processing device, processor, compute device, or compute element may refer to any device or portion of a device that processes electronic data from registers and/or memory to transform that electronic data into other electronic data that may be stored in registers and/or memory.
RAM—random access memory. Some types are static RAM (SRAM), dynamic RAM (DRAM), magnetic RAM (MRAM), resistive RAM (RRAM), conductive bridging RAM (CBRAM), etc.
RDL—redistribution layer—an extra metal layer on an IC to make bondpads available at other locations of the die.
SCM—storage-class memory
SLD—superluminescent diode
SSD—solid-state drive
SOA—semiconductor optical amplifier
TPU—tensor processing unit
UCIe—Universal Chiplet Interconnect Express—an open specification for a die-to-die interconnect and serial bus between chiplets.
VCSEL—vertical-cavity surface-emitting lasers
A waveguide is an implementation of a unidirectional photonic path in an optical transmission medium.
WDM—wavelength division multiplexing.

Implementations

Implementations herein relate to resolving power, latency, or pin-count concerns by providing various OMIB configurations and various packages that include at least one OMIB. FIG. 1 is a top view of a wafer 100 and die 102 that may include, or be included in, one or more microelectronic packages with an OMIB, in accordance with various implementations. The wafer 100 may be composed of semiconductor material and may include one or more dies 102 having IC structures formed on a surface of the wafer 100. Each of the dies 102 may be a unit of a semiconductor product that includes a suitable IC. After the fabrication of the semiconductor product is complete, the wafer 100 may undergo a singulation process in which the dies are separated from one another to provide discrete "chips" of the semiconductor product. Die 102, and at least one other die, may be included in a microelectronic package with an OMIB.

The OMIB can be formed in a second process using a second wafer (not shown) in a manner analogous to the fabrication of the die 102. The OMIB is a photonic integrated circuit (PIC) and has optical components fabricated therein, as opposed to the die 102 which is an electronic integrated circuit (EIC) and typically has electronic elements fabricated therein. The OMIB can be embedded into a package substrate. The package substrate may be considered to be a cored or coreless substrate. The package substrate may include one or more layers of a dielectric material which may be organic or inorganic. The package substrate may further include one or more conductive elements such as vias, pads, traces, microstrips, strip lines, and the like. The conductive elements may be internal to, or on the surface of, the package substrate. Generally, the conductive elements may allow for the routing of signals through the package substrate or between elements coupled to the package substrate. In some implementations the package substrate may be, for example, a printed circuit board (PCB), an interposer, a motherboard, or some other type of substrate.

Figure 2:
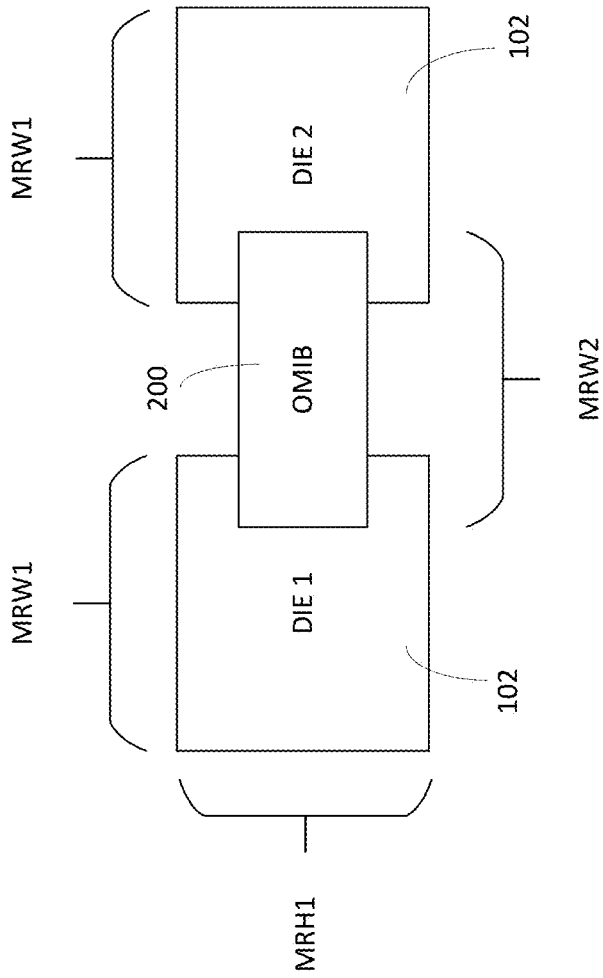
FIG. 2 shows an example OMIB with two dies it is bridging.

FIG. 2 shows an example OMIB with two dies it is bridging. The OMIB 200 formed in the second stage of the fabrication process may share a dimension with each die 102 (horizontal or vertical) that was formed in the first stage of the fabrication process. The die may be as large as possible within the size limits of a reticle that is used to manufacture it. In FIG. 2, the dies 102 have a width that corresponds to the maximum reticle width MRW1 of an EIC reticle and a height that corresponds to the maximum reticle height MRH1 of an EIC reticle, and the OMIB 200 has a width that corresponds to the maximum reticle width MRW2 of a PIC reticle. This may be for convenience and cost-savings during the fabrication and is not limiting on various implementations.

In some implementations, the wafer 100 or the die 102 may include a memory device, a compute device, or both (examples include, but are not limited to, a random-access memory (RAM) device, (such as a static RAM (SRAM) device, a magnetic RAM (MRAM) device, a resistive RAM (RRAM) device, or a conductive-bridging RAM (CBRAM) device), a logic device (e.g., an AND, OR, NAND, NOR, or EXOR gate), a NAND flash memory, a solid-state drive (SSD) memory, a NOR flash memory, a CMOS memory, a thin film transistor-based memory, a phase-change memory (PCM), a storage class memory (SCM), a magneto-resistive memory (MRAM), a resistive RAM, a DRAM, a high bandwidth memory (HBM), a DDR-based DRAM, a DIMM memory, a CPU, a GPU, an MPU, a tensor engine, a load/store unit (LDSU), a neural compute engine, a dot-product and/or convolution engine, a field-programmable gate array (FPGA), an AI accelerator, or any other suitable circuit element. Multiple ones of these devices may be combined on a single die 102. For example, die 102 may include a memory comprising multiple memory arrays, one or more processors, other logic, communication circuits, and power management functions, and execute instructions stored in the memory array, or otherwise interact with the memory array using the processors on die 102.

Figure 3:
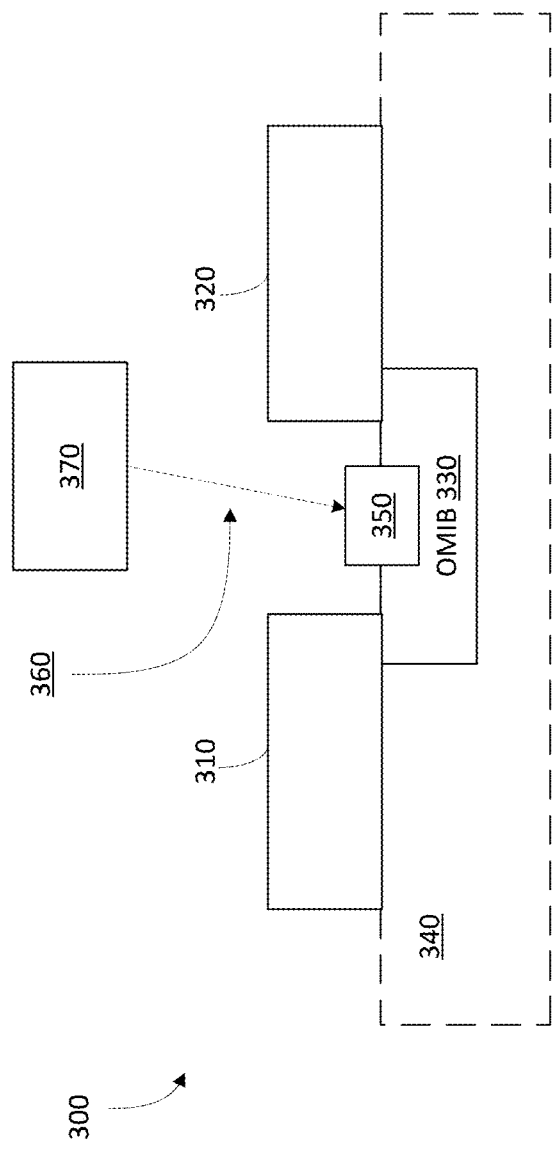
FIG. 3 shows an example package that die two dies can be coupled with via electrical interconnects.

FIG. 3 shows an example package 300 that die 310 and die 320 can be coupled with via electrical interconnects. The package 300 includes OMIB 330 acting as a bridge between die 310 and die 320. An optional substrate 340 has been coupled to OMIB 330 such that OMIB 330 is embedded in the substrate 340. Although shown as flush in FIG. 3, OMIB 330 may not be flush with the surface of the substrate 340, but rather may at least partially protrude from substrate 340 or be embedded in an inner layer of substrate 340. Various of the elements depicted may be at the surface of, or at least partially protruding from, OMIB 330 or dies 310 and/or 320. Additionally, the specific number of elements, the number of interconnects, dies, and other devices, may be different in other implementations. In some implementations, the package may include an adhesive, a sealant, an underfill, a mold, an overmold, or some other structural or dielectric material. In some implementations, certain elements may be positioned at a different location within a signal path relative to other elements. An optical interface (OI) 350 is included on a surface of the OMIB 330. Optical interface 350 may couple with a light engine 370 to receive unmodulated light through fiber(s) 360, and/or with an external device optical interface to exchange modulated and/or unmodulated light in either direction. Additional to optical interface 350, there may be one or more electrical interfaces on the surface of OMIB 330 to interface with external electrical devices.

Various implementations can use different types of light engines. The light engine can be external or integrated into the OMIB. Example implementations can use the following light engines to bring an optical signal to and from a package that includes OMIB 330: laser diodes—these are highly coherent light sources that produce a narrow beam of light, and that are widely used in photonic chips for data communication and sensing applications; light-emitting diodes (LEDs)—a type of diode that emits light when a current passes through it (they are low-cost, compact, and have a long lifetime, making them a popular choice for photonic chips); superluminescent diodes (SLDs)—SLDs are similar to LEDs, but they emit a wider, broadband light spectrum (SLDs are used for applications such as optical amplification, wavelength division multiplexing, and fiber optic sensing); vertical-cavity surface-emitting lasers (VCSELs)—these are lasers that emit light perpendicular to the chip surface, making them ideal for applications in photonics (VCSELs are widely used in data communication and sensing applications, such as 3D sensing, LiDAR, and data center interconnects); and silicon photonics-devices that use the light-carrying properties of silicon to produce light sources on silicon chips (silicon photonics has the potential to revolutionize photonics by reducing the size, cost, and power consumption of photonic components). These are some of the most commonly used light sources with a package that includes an OMIB 330. The choice of light engine depends on the specific requirements of the implementation, such as wavelength, power, and modulation speed.

The light engine may be located locally on OMIB 330 or connect to OMIB 330 via fiber 360. When integrated onto the PIC, distributed fiber Bragg (DFB) lasers or quantum dot lasers can be attached during processing or integrated in the native technology where possible. When remote, any packaged continuous wave (CW) laser suitable in power and spectrum for the modulation technology may be used. In one implementation, the light source is a set of DFB lasers attached to a silicon interposer and connected to the PIC via optical fibers.

The optical interface 350 is used to terminate optical fibers at the edge or the top of OMIB 330 for optical input and/or output to occur from external processes or devices that are communicatively coupled to package 300 via the fibers. The choice of OI depends on the specific requirements of the implementation, such as the wavelength of light, the coupling efficiency, and the cost. Optical interface 350, and any other optical interfaces in and on OMIB 330, can include any means for optical interfacing between a fiber and a photonic IC, for example: an edge coupler; a grating coupler (CG); a graded index (GRIN) lens coupler, a fiber Bragg grating (FBG) coupler, a micro-lens array (MLA) coupler, an evanescent wave (EW) coupler, an adiabatic coupler, a wavelength division multiplexing (WDM) coupler, a prism coupler, a butt coupler, an end-fire coupler, and a V-groove coupler.

In one implementation, optical interface 350 includes a fiber array unit (FAU) to connect the OMIB optically to a light source and/or an optical I/O unit. The FAU is a device used in optical communication systems that combines or separates optical signals from multiple fibers into a single optical signal or multiple optical signals, respectively. The FAU can be used for a variety of applications, such as wavelength division multiplexing (WDM), parallel optical interconnects, and optical sensing. There are two main types of fiber array units that can be used: linear and circular. Linear FAUs combine or separate optical signals along a straight line, while circular fiber array units combine or separate optical signals in a circular configuration. Both types of fiber array units are typically made from a precision-molded optical plastic or ceramic material and can have anywhere from a few to hundreds of fibers arranged in a specific pattern. The choice of FAU depends on the specific requirements of an application, such as the number of fibers, the arrangement of the fibers, the wavelength of light being used, and the coupling efficiency desired. Each die can have an associated analog/mixed-signal (AMS) block associated with a portion of the OMIB it is coupled to and one or more transistors or supporting circuitry to route electrical signals to the transistors, or some other IC component.

OMIB 330 may further include one or more electrical interfaces (EIs). OIs and EIs may be affixed to a surface of the OMIB, either between the bridged dies 102 or offset in a region in the x or y direction where a die 102 does not extend. The EI has a function analogous to the OI, except it gives the OMIB the capability to transmit data to and from the dies via electrical connections instead of optical ones and can connect the external I/O block to the OMIB, for instance, via a wire from the EI to the external I/O block. Different types of electrical connections are possible including wires, RDLs and the like. The electrical connection typically transmits and receives data electrically across the electrical interconnection using known standards or bus protocols between the EI and any of the dies bridged by the OMIB or the EI and the external I/O block. The electrical pathways between the EI and the dies can be routed through the OMIB, through the substrate, or both (or in the case of an RDL through one of the layers of the OMIB and/or substrate).

Figure 4:
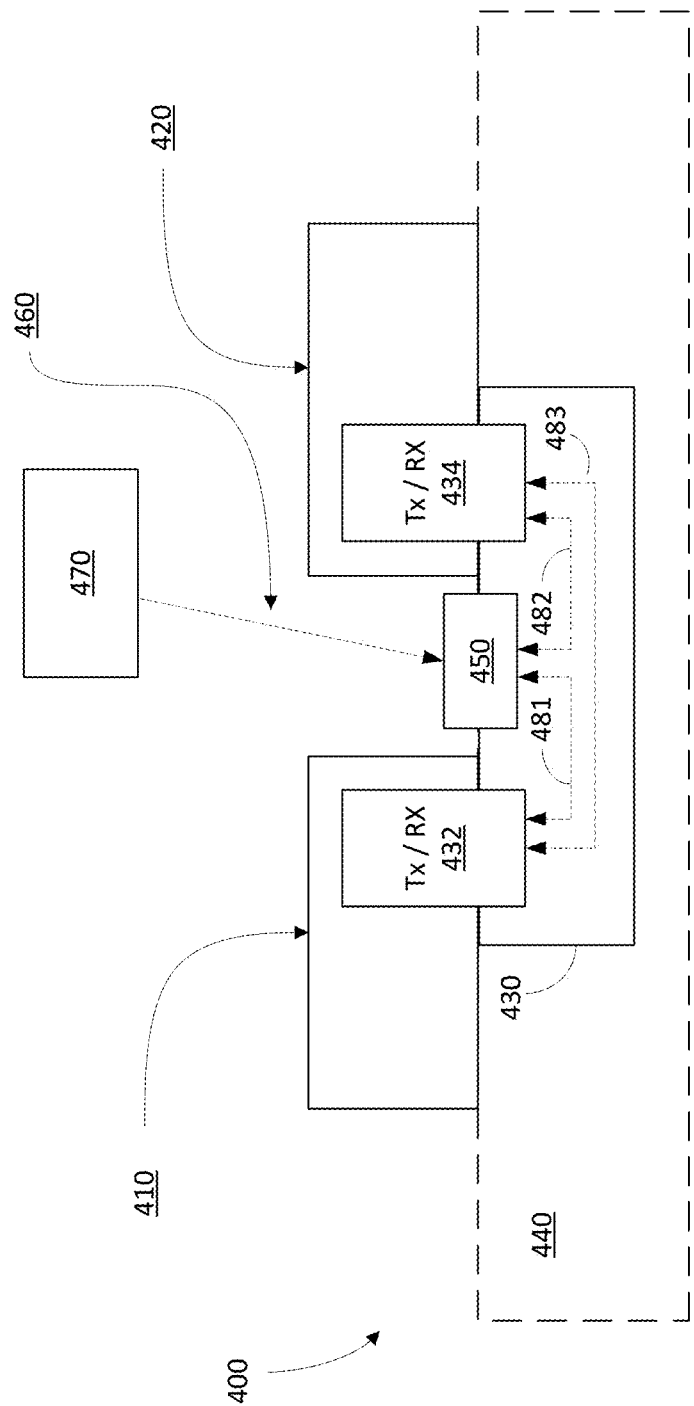
FIG. 4 shows an example package that two dies can be coupled with via electrical interconnects.

FIG. 4 shows an example package 400 that die 410 and die 420 can be coupled with via electrical interconnects. Package 400 is similar to package 300 of FIG. 3, with like element numbering, in addition to which it shows a first photonic transceiver 432 and second photonic transceiver 434. A portion of the first transceiver 432 is in die 410 and a portion of the second photonic transceiver 434 is in die 420. Another portion of first transceiver 432 is in OMIB 430, and another portion of second transceiver 434 is in OMIB 430. FIG. 4 shows bidirectional photonic paths 481, 482, and 483. Bidirectional photonic path 483 connects first photonic transceiver 432 and second photonic transceiver 434. Bidirectional photonic path 483 can include two or more unidirectional photonic paths in opposite directions to create a bidirectional path between the two transceivers to enable optical communication and/or data movement across the photonic channel in both directions between the two dies 410 and 420. Bidirectional photonic path 481 links photonic transceiver 432 to optical interface 450, and bidirectional photonic path 482 links photonic transceiver 434 to optical interface 450. Optical interface 450 is coupled with light engine 470 via fiber(s) 460. Bidirectional photonic paths 481-483 may form a photonic network inside OMIB 430. Optical interface 450 may include any means for interfacing between a fiber and a photonic IC. Substrate 440 is optional.

A photonic path may be implemented in an optical transmission medium. The optical transmission medium may include a waveguide on a PIC, an optical fiber or other optical transmission medium (such as free space optics or glass-etched waveguide), or some combination of the foregoing. Examples of optical modulators include, but are not limited to, electro-absorption modulators (EAMs), micro-ring resonators, or any suitable optical component with sufficient thermal stability.

FIGS. 5A-E show example packages that use a light engine to provide an optical signal for use by the photonic network. The light engine can include a laser diode, optics, and/or control electronics. The laser diode is the source of the laser light, and the optics are used to shape and control the output of the laser. Control electronics (not drawn) provide the necessary power and modulation to the laser diode to generate the desired output. In the implementations of FIGS. 5A-E, the light engine provides an optical signal through an optical interface such as an FAU and a GC, to a splitter, a modulator (MOD) abutting an AMS block in a first die, and finally to a photo detector (PD) abutting the AMS block of a second die. Where the laser is in a chiplet light engine (as will be described with reference to FIG. 7A), an FAU is not needed, and light can be guided directly into the GC. The photonic networks in the OMIBs of FIGS. 5A-E enable multiple optical paths. Although FIGS. 5A-E show a GC and FAU jointly forming an optical interface, implementations may use any means for interfacing between a fiber and a photonic IC.

FIG. 5A shows an example 500 of intra-OMIB connections, illustrating the optical paths starting at the light engine 570. FIG. 5A includes first die 510, divided in a general part 510B that may include various processing, storage, and communication functions, and an AMS part 510A that includes analog/mixed-signal circuits for interfacing with OMIB 530. It further includes an optional substrate 540 and light engine 570. AMS part 510A of first die 510 may include a driver (DRV1) and a transimpedance amplifier (TIA1). AMS part 520A of second die 520 may include a driver (DRV2) and a transimpedance amplifier (TIA2).

Light engine 570 transmits light via the fiber array unit FAU and grating coupler GC (or any other OI configured to receive light on an OI input and to pass the received light on an OI output) into splitter SP inside OMIB 530. Splitter SP distributes the light over two different photonic paths 531 and 532 towards modulator MOD1 and modulator MOD2. In some implementations, the splitter, or a splitter tree, distributes the light over more than two different photonic paths to feed additional modulators. A photonic path may be implemented with any suitable optical transmission medium, and may include a mixture of waveguides and fibers.

Modulator MOD1 modulates the light it receives from the splitter SP with information from driver DRV1, and transmit the modulated light to photodetector PD2 via photonic path 533. Photodetector PD2 converts the received light to an electrical signal for second die 520. Modulator MOD2 modulates light it receives from the splitter SP with information from driver DRV2, and transmit the modulated light to photodetector PD1 via photonic path 534. Photodetector PD1 converts the received light to an electrical signal for first die 510. Jointly with a serializer (not shown) in first die 510, driver DRV1, transimpedance amplifier TIA2, and a deserializer (not shown) in second die 520, modulator MOD1, photonic path 533, and photodetector PD1 form a data channel from first die 510 to second die 520.

OMIB 530, a photonic IC, includes a first interconnect region, a second interconnect region, and an offset region. The first interconnect region includes a bondpad pattern located over MOD1 and PD1 that matches a bondpad pattern on first die 510 located under DRV1 and TIA1, or is otherwise configured to form an electrical interconnection between the respective components. The second interconnect region includes a bondpad pattern located over PD2 and MOD2 that matches a bondpad pattern on second die 520 located under TIA2 and DRV2, or is otherwise configured to form an electrical interconnection between the respective components. The offset region, which is further illustrated in FIG. 6, includes optical interfaces such as GC/FAU. Two or more bondpads of the bondpad pattern on first die 510 are physically and electrically coupled with two or more bondpads of the bondpad pattern in the first interconnect region, and two or more bondpads on the bondpad pattern on the second integrated circuit are physically and electrically coupled with two or more bondpads of the bondpad pattern in the second interconnect region. One or more of the two or more bondpads on first die 510 may be located more than 100 microns (100 µm) from the edge of first die 510. One or more of the two or more bondpads on second die 520 may be located more than 100 microns (100 µm) from the edge of second die 520. The distance between the (lower) surface of first die 510 and the (top) surface of OMIB 530 is less than 2 mm and in many cases less than 50 microns. The distance between the (lower) surface of second die 520 and the (top) surface of OMIB 530 is less than 2 mm and in many cases less than 50 microns.

FIG. 5B shows the same example, illustrating only the signal path. Paths for unmodulated light have been omitted. FIG. 5B shows one signal path in bold lines as follows. Interface I/F1 in first die 510 delivers a digital signal carrying information to be transmitted from general part 510B of first die 510 to driver DRV1. Driver DRV1 converts the digital signal to an analog electrical signal suitable for driving a photonic modulator and delivers the analog electrical signal to modulator MOD1 in OMIB 530. Modulator MOD1 sends light modulated with the information to be transmitted to photodetector PD2 via photonic path 533. Photodetector PD2 converts the modulated light to a current signal, and delivers the current signal to transimpedance amplifier TIA2, which amplifies the signal and converts it to a voltage signal for suitable for digital interface I/F2. Interface I/F2 converts the voltage to a digital signal suitable for processing in general part 520B of second die 520. Similarly, information to be transmitted from general part 520B of second die 520 to general part 510B of first die 510 travels via I/F2, DRV2, MOD2, photonic path 534, photodetector PD1, transimpedance amplifier TIA1, and interface I/F1.

Photonic paths 533 and 534 include waveguides or other suitable optical transmission media to carry the optical signals from a modulator to a photodetector. The modulators in OMIB 530 are coupled with drivers in the AMS parts of the first or second die via a copper pillar or other suitable electrical interconnect. The photodetectors in OMIB 530 are coupled with transimpedance amplifiers in the AMS parts of the first or second die via a copper pillar or other suitable electrical interconnect. Photonic paths in OMIB 530 may be unidirectional, so that a pair of photonic paths in opposite directions can be comprised in a single bidirectional information channel.

An electrical interconnect is shown as making a coupling (or abutted coupling) between elements in the AMS parts and the corresponding elements in OMIB 530. In one implementation, the interconnect is a copper pillar no longer than 2 millimeters. In other implementations, the electrical interconnects can be solder bumps that are formed of a material such as tin, silver, or copper. If solder bumps are used for the interconnects, then the solder bumps may be flip-chip bumps. In yet other implementations, the interconnects may be elements of a ball-grid array (BGA), pins of a pin grid array (PGA), elements of a land grid array (LGA), or some other type of interconnect. Generally, the interconnects may physically and electrically couple the AMS blocks to OMIB 530. For example, one or more of the interconnects may physically couple with, and allow electrical signals to pass between, pads of the dies and pads of substrate 540 and/or OMIB 530. The interconnects 525 may not have a uniform size, shape, or pitch. A finer pitch of interconnects may be desirable to allow a denser communication pathway between elements coupled to the OMIB. In implementations, the size, shape, pitch, or type of one or more of the interconnects may be different than depicted in the figures, or different than others of the interconnects. The specific type, size, shape, or pitch of the interconnects may be based on one or more factors such as use case, materials used, design considerations, and manufacturing considerations.

FIG. 5C shows an example of inter-OMIB connections. Paths for unmodulated light have been omitted. First die 510 and second die 520 can photonically communicate with external device optical interface 571 with OMIB 580 and fibers 561. For example, first die 510 may transmit to external device optical interface 571 via I/F1, DRV1, MOD1, photonic path 581, optional multiplexer MUX (in case wavelength division multiplexing is desired), GC, FAU, and fibers 561. Conversely, first die 510 may receive from external device optical interface 571 via fibers 561, FAU, GC, photonic path 583, optional demultiplexer DEMUX (in case wavelength division multiplexing is desired), PD1, TIA1, and I/F1.

Figure 5D:
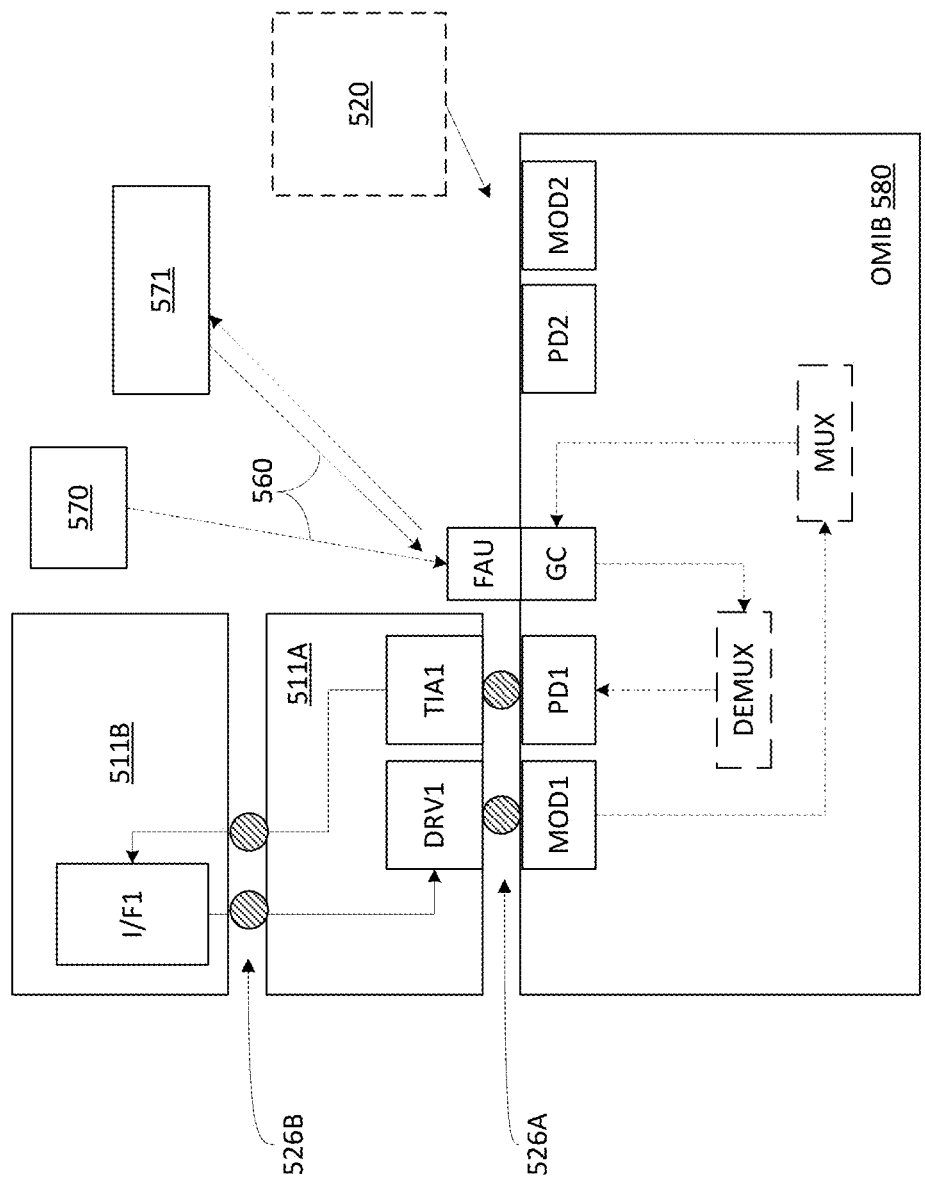

FIG. 5D shows an example of a stacked-dies arrangement. The AMS circuits (DRV1 and TIA1) are included in a first AMS die 511A, and general/digital circuits are included in a first general die 511B. First AMS die 511A is stacked on top of OMIB 580 via electrical interconnects 526A, and first general die 511B is stacked on top of first AMS die 511A via electrical interconnects 526B. OMIB 580 interfaces with light engine 570 and/or external device optical interface 571 via fibers 560, and may further interface with a second die 520.

Figure 5E:
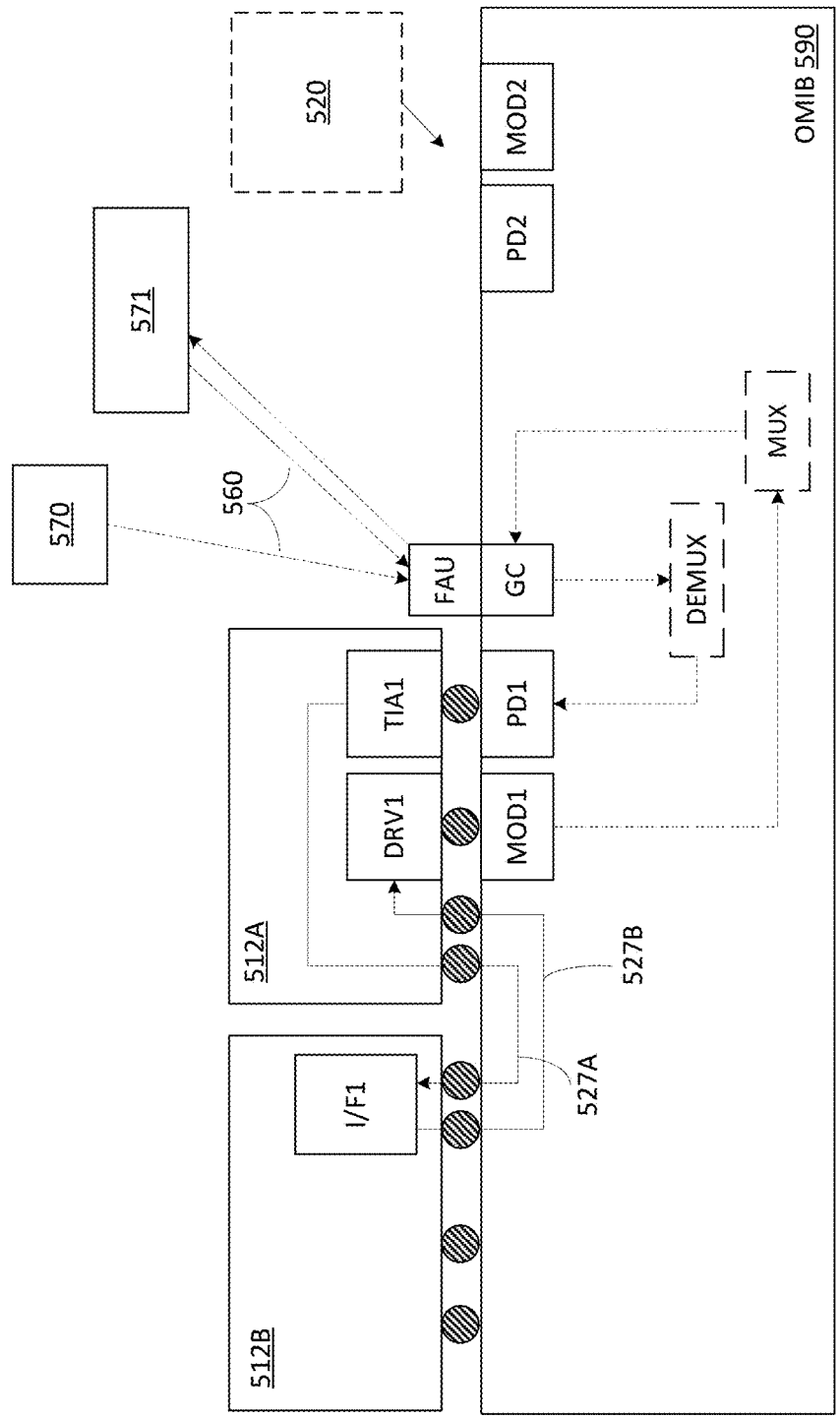

FIG. 5E shows an arrangement where the first general die 512B and the first AMS die 512A are separately stacked on OMIB 590 and positioned side by side. An electrical interconnection such as a bus enables signals to and from first general die 512B and the first AMS die 512A (e.g., using UCIe, PCIe, or any suitable protocol). The electrical interconnection may include an electrical path 527A from TIA1 to I/F1, and an electrical path 527B from I/F1 to DRV1.

Figure 6:
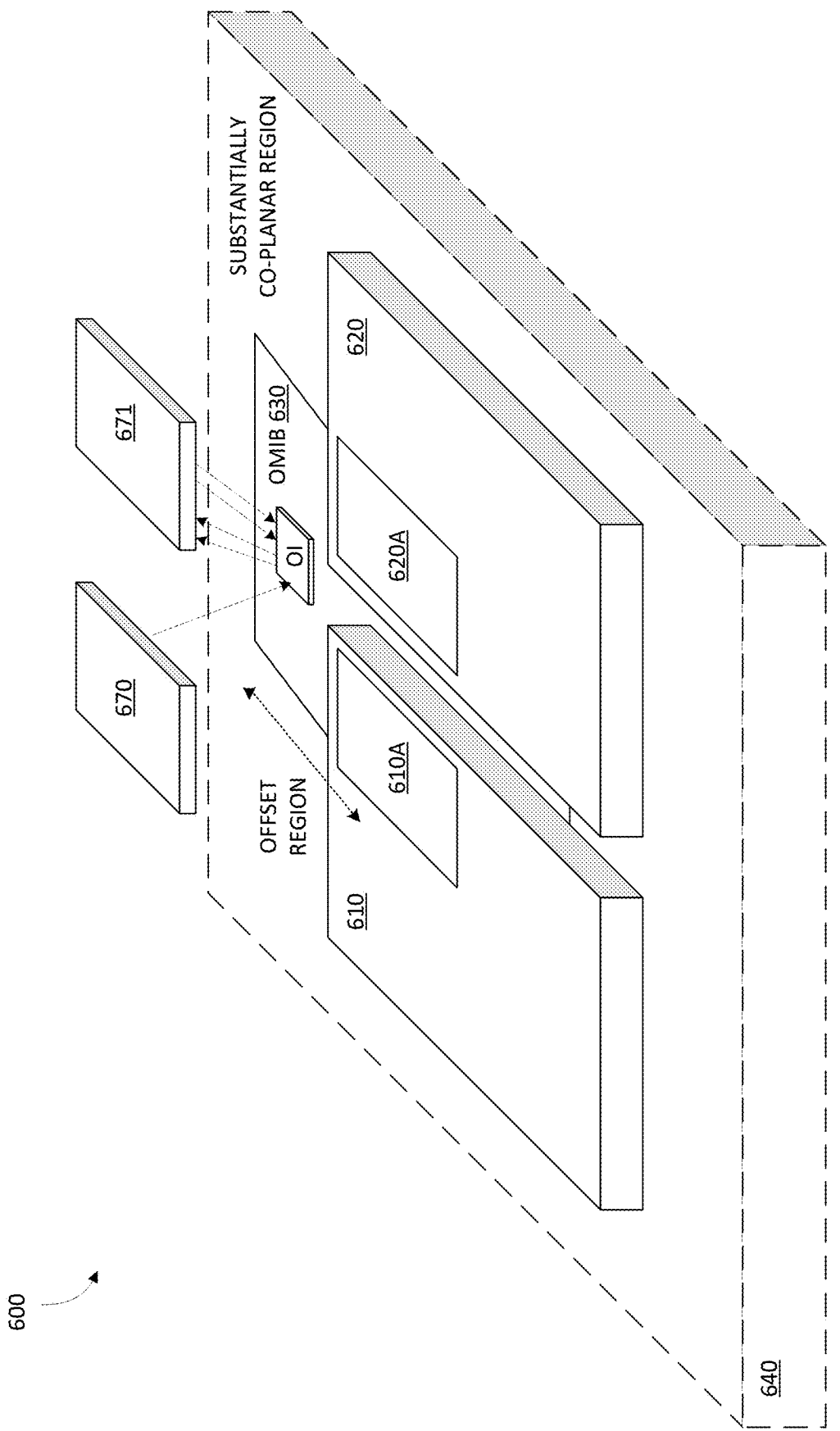
FIG. 6 shows a perspective view of an example OMIB that bridges two dies and that is coupled with a light engine.

FIG. 6 shows a perspective view 600 of an example OMIB 630 that bridges two dies (first die 610 and second die 620) and that is coupled with a light engine 670. Substrate 640 is optional. First die 610 and second die 620 each have an AMS block (first AMS part 610A and second AMS part 620A) in a region that overlaps OMIB 630 such that the AMS blocks abut OMIB 630 and/or are stacked on OMIB 630 in a configuration that couples first die 610 with OMIB 630 via an electrical interconnect, and that also couples second die 620 with OMID 630. The interconnect could be made with a copper pillar or any other suitable electrical interconnect. An offset portion of the OMIB creates an offset region where the OI and/or the external light engine 670 can be positioned. External light engine 670 provides a light source for the photonic network via the OI. An external device optical interface 671 provides bidirectional communication with the dies via fibers between the OI and external device optical interface 671. In FIG. 6, the top surface of OMIB 630 and substrate 640 are shown as being substantially co-planar, although as previously stated, OMIB 630 is not required to be flush with the surface of substrate 640. The bottom surface of first die 610 or second die 620 may be physically and electrically coupled with the top surface of OMIB 630. If the first portion of the transceiver (modulator and/or PD in OMIB 630) line up with the second portion of the transceiver (the AMS part 610A or AMS part 620A), then OMIB 630 and first die 610 or second die 620 form an abutted coupling.

Figure 7A:
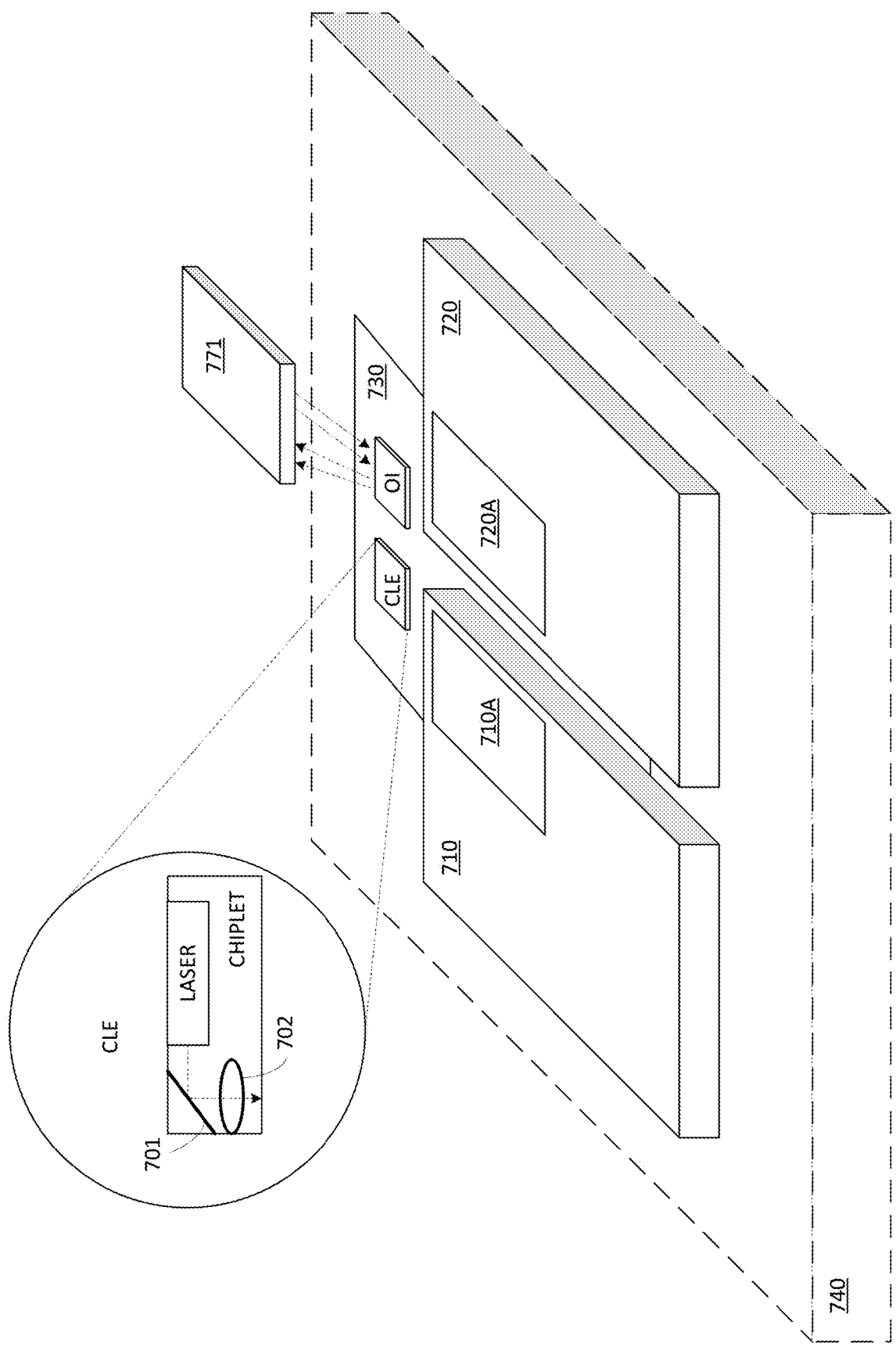
FIG. 7A shows a perspective view of an example OMIB that bridges two dies and that receives unmodulated light from a chiplet light engine (CLE).

FIG. 7A shows a perspective view of an example OMIB 730 that bridges two dies and that receives unmodulated light from a chiplet light engine (CLE). Substrate 740 is optional. First die 710 and second die 720 each include an AMS block (710A, 720A) in a region that overlaps OMIB 730 such that the AMS blocks are above OMIB 730 and/or stacked on OMIB 730 in a configuration that couples the two dies to OMIB 730 via suitable electrical interconnects (e.g., where a modulator is positioned directly over a driver and a TIA is positioned directly over a PD). The CLE is positioned in the offset region of OMIB 730. The CLE includes a laser that may be positioned in parallel with the surface of OMIB 730, a first optical component (for example, a mirror 701 to reflect the laser beam downwards or to a side), and a second optical component (for example, a lens 702 to focus the laser beam onto a smaller area), wherein the first optical component, and a second optical component may be configured to turn the light substantially ninety (90) degrees to enable the light from the laser to be directed into the OMIB. Inside the OMIB, the light may enter a GC that also includes a ninety-degree mirror, so that the light may enter a waveguide that runs parallel to the surface of the OMIB. An external device optical interface 771 communicates bidirectionally with the dies via fibers between the OI and external device optical interface 771.

Figure 7B:
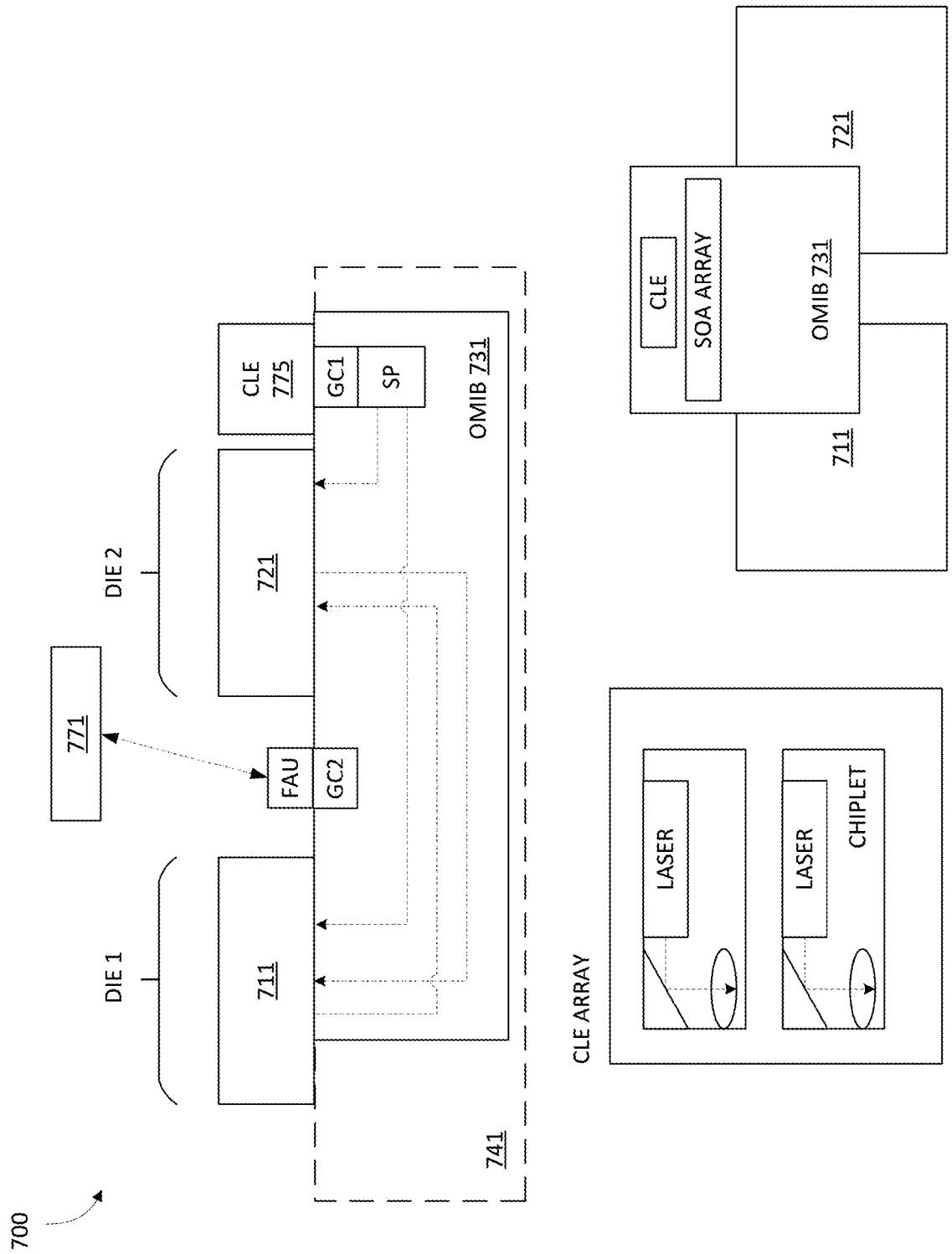
FIG. 7B shows an example package that can use a CLE.

FIG. 7B shows an example package 700 that can use a CLE 775. Substrate 741 is optional. An optical signal is provided through the OMIB 731 from CLE 775 to a grating coupler CG1 (or any other means of interfacing between a fiber and a photonic IC) and splitter SP, from where it is guided first die 711 and second die 721. OMIB 731 also provides optical paths in both directions between the dies. A second grating coupler CG2 and an FAU, or other relevant fiber connector using any other means of interfacing between a fiber and a photonic IC, can provide access from and to external device optical interface 771. In some implementations, CLE 775 may be included in a CLE array. In further implementations, CLE 775 may include a semiconductor optical amplifier (SOA) or an SOA array to amplify the power of the unmodulated light.

Figure 8A:
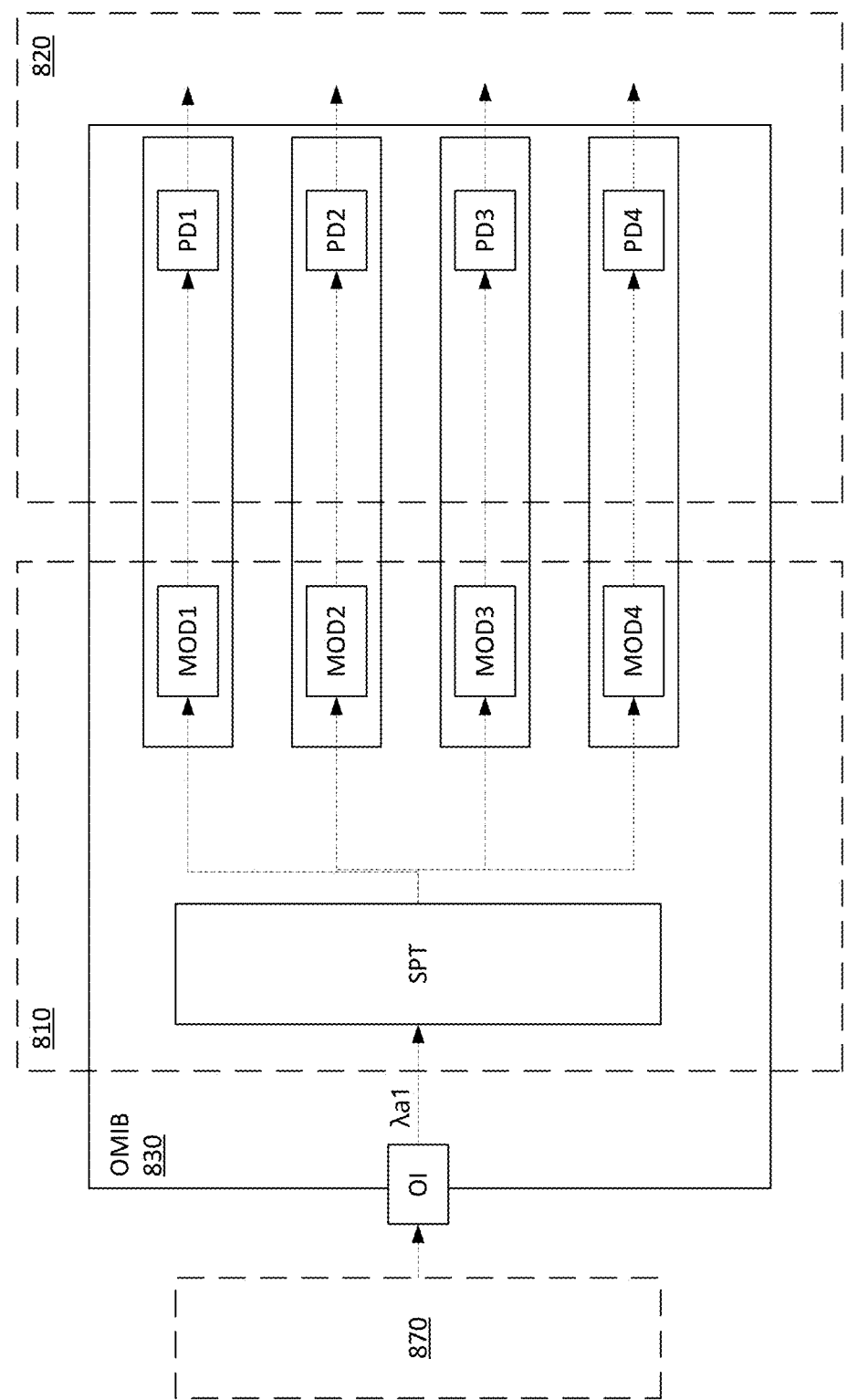
FIG. 8A is a diagram illustrating an example OMIB having photonic links capable of connecting two dies within a package, according to some implementations.

FIG. 8A is a diagram illustrating an example OMIB 830 having photonic links capable of connecting two dies within a package, according to some implementations. OMIB 830 provides optical communication from each modulator (MOD1-4) in first die 810 to each photodetector (PD1-4) in second die 820. A waveguide system in the OMIB can bridge and/or enable a connection between a transmit unit (not shown) in a first die 810 and a receive unit (not shown) in a second die 820. A light engine 870, which can be internal or external to OMIB 830, outputs carrier light at a single wavelength $\lambda a1$. A splitter tree SPT may divide the light, having wavelength $\lambda a1$, over multiple optical paths (four have been drawn) leading to the modulators MOD1-4. The modulators modulate the light having the single wavelength $\lambda a1$ and transmit the modulated light via respective waveguides to photodetectors PD1-4. FIG. 8A shows four links, each including a modulator, a photonic path, and a photodetector. Each link may be part of a lane, which further includes a serializer and a deserializer. Multiple lanes may be bonded together in a single channel, which may be unidirectional or bidirectional.

Figure 8B:
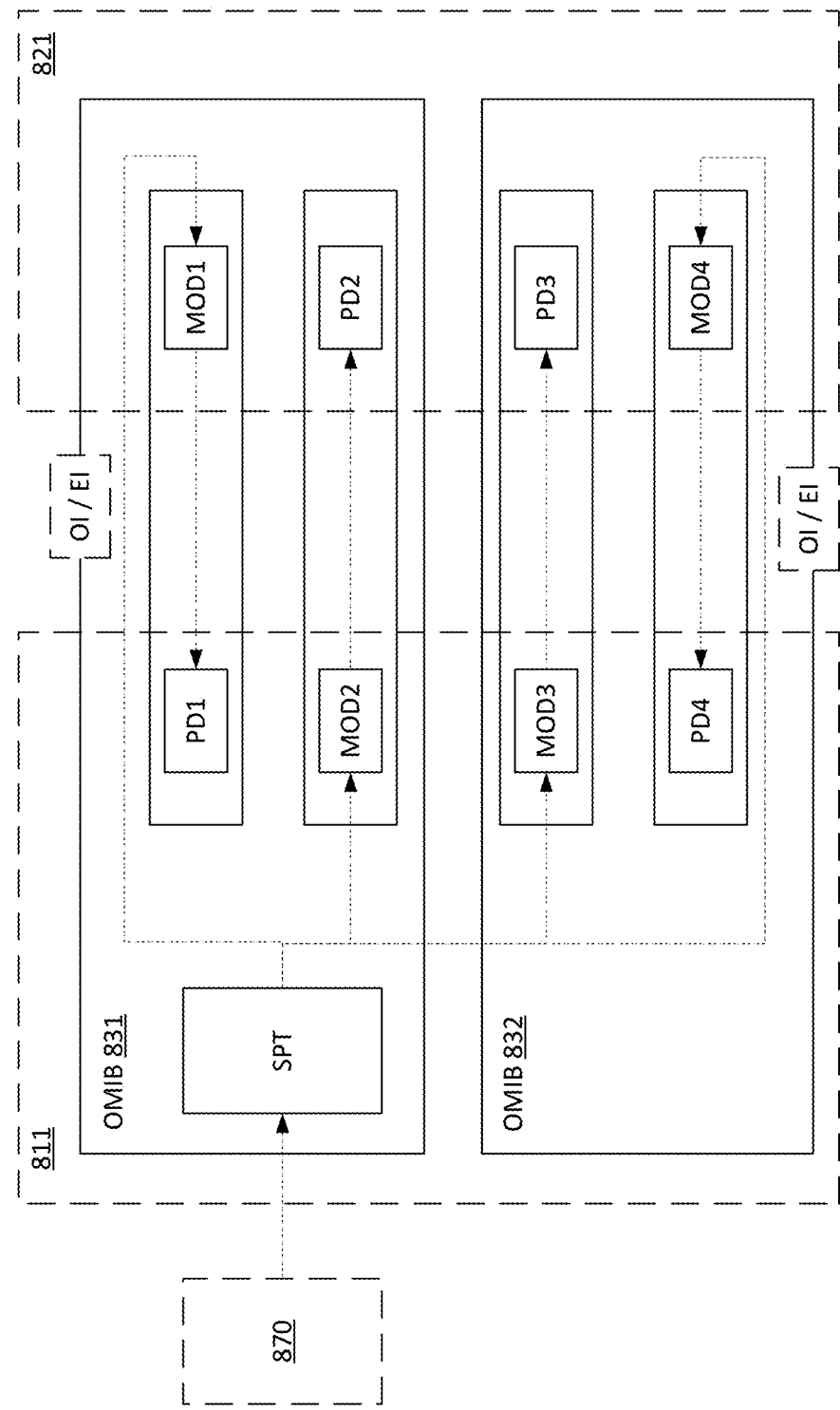
FIG. 8B shows one implementation having two OMIBs coupled between a first die and a second die.

FIG. 8B shows one implementation having two OMIBs 831 and 832 coupled between first die 811 and second die 821. A light engine 870 outputs carrier light to a splitter tree SPT, which may divide the light between multiple optical paths leading to the modulators MOD1-4 associated with one or more photonic channels. For example, a first bidirectional photonic channel may include the links MOD1/PD1 and MOD2/PD2, and a second bidirectional photonic channel may include the links MOD3/PD3 and MOD4/PD4.

Figure 9:
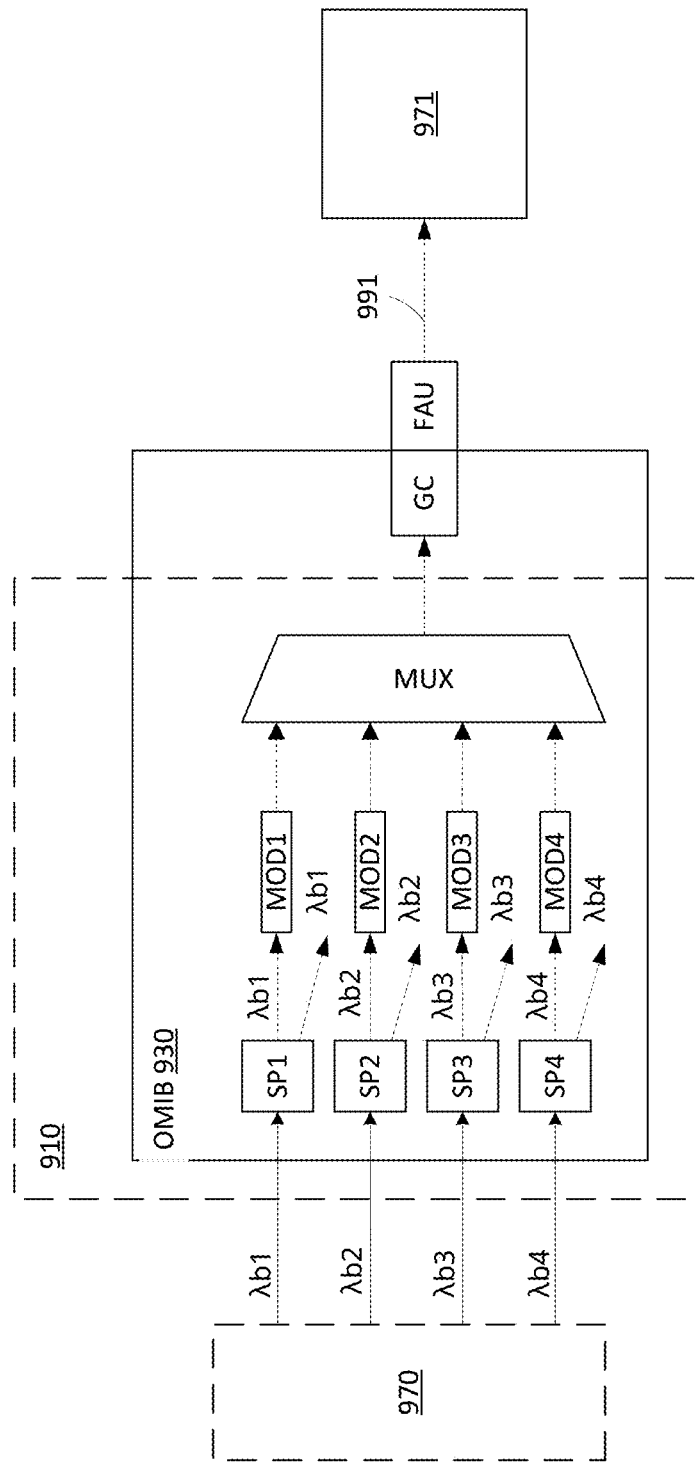
FIG. 9 is a diagram illustrating an example system of a link that uses WDM for communication from a die to an external device, according to some implementations.

FIG. 9 is a diagram illustrating an example system of a link that uses WDM for communication from a die to an external device, according to some implementations. In this example, first die 910 and external device are coupled through a grating coupler GC and an FAU (or any other means for optical interfacing between a fiber and a photonic IC) in the OMIB 930, an optical fiber 991, and external device optical interface 971.

A light engine 970, which can be internal or external, provides light of multiple wavelengths (e.g., between 2 and 16 wavelengths), such as four wavelengths $\lambda b1$, $\lambda b2$, $\lambda b3$, $\lambda b4$, as shown, to OMIB 930. A splitter tree SPT (e.g., similar to that of FIG. 8A) may divide the light at the multiple wavelengths between multiple different channels or different links (e.g., two links, where only one is fully shown), which may be in different OMIBs or different PICs. The carrier light at the wavelengths $\lambda b1$, $\lambda b2$, $\lambda b3$, $\lambda b4$ is provided to the optical modulators MOD1-4 which may modulate the four light beams with different parts of the information to be transmitted, and a WDM multiplexer (MUX) combines the four light beams into a single beam that includes the four different wavelengths. The single beam of light is then transmitted to external device optical interface 971 via the GC, FAU and optical fiber 991.

Figure 10:
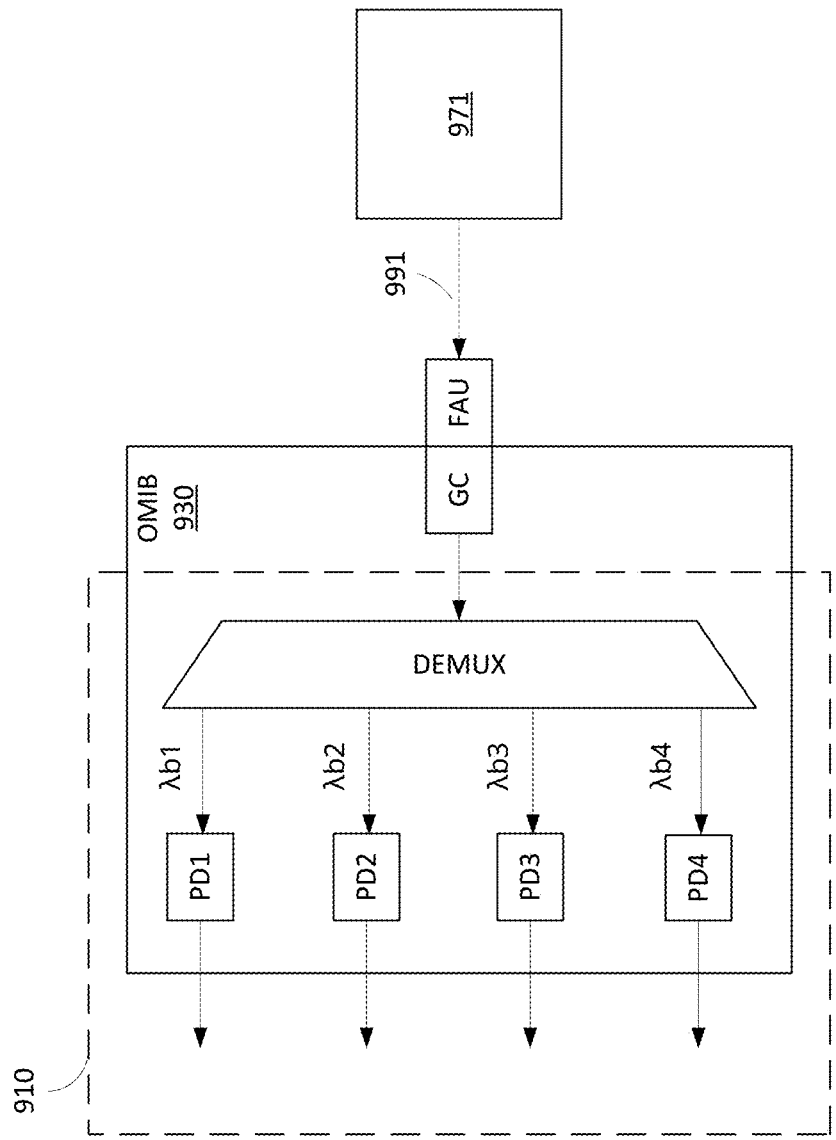
FIG. 10 illustrates an example reverse channel for the WDM system in FIG. 9, according to some implementations.

FIG. 10 illustrates an example reverse channel for the WDM system in FIG. 9, according to some implementations. External device optical interface 971 provides an optical signal via the fiber 991, FAU, and GC to a WDM demultiplexer (DEMUX) in OMIB 930. The WDM demultiplexer separates the optical signal into four separate modulated signals having wavelength λb1, λb2, λb3, λb4. These four signals are provided, via respective optical waveguides, to photodetectors PD1-4, which interface electrically with first die 910 to provide the information from the external device to first die 910.

Although the implementation discussed above is directed to a photonic channel showing four optical links in one direction and a WDM multiplexer receiving four different wavelengths, in other implementations, two or more optical links and a WDM multiplexer receiving two or more different wavelengths may be used. The WDM demultiplexer would, accordingly, output two or more different wavelengths corresponding to these alternative implementations.

Using intra-OMIB and inter-OMIB photonic channels, e.g., as described above, generally including one or more links per direction, the processors in the EIC(s) in a single package can be connected into electro-photonic networks. The resulting network topology generally depends on the selection of pairs of dies that are coupled via an associated photonic channel; various example topologies are known in the art. Note that, while this document generally refers to bidirectional photonic channels, which, as compared with unidirectional photonic channels, result in network structures providing greater flexibility for implementing ML and other computational models, electro-photonic networks can in principle also be formed with unidirectional photonic channels, and such networks may retain any of the benefits discussed herein (e.g., power savings due to photonic data transfer over longer distances).

As previously stated, a photonic channel includes at least two unidirectional sets of one or more links, capable of making a bidirectional channel. Examples of such a channel include, but are not limited to, the photonic channel between two dies, when bridged by an OMIB and the photonic channel between an OI on an OMIB and an external device optical interface. The nature of the external device optical interface can vary so long as it has the optical capability to receive messages sent from the OMIB and/or send messages that can be received and used by the OMIB or any dies using the OMIB as a bridge.

Figure 11:
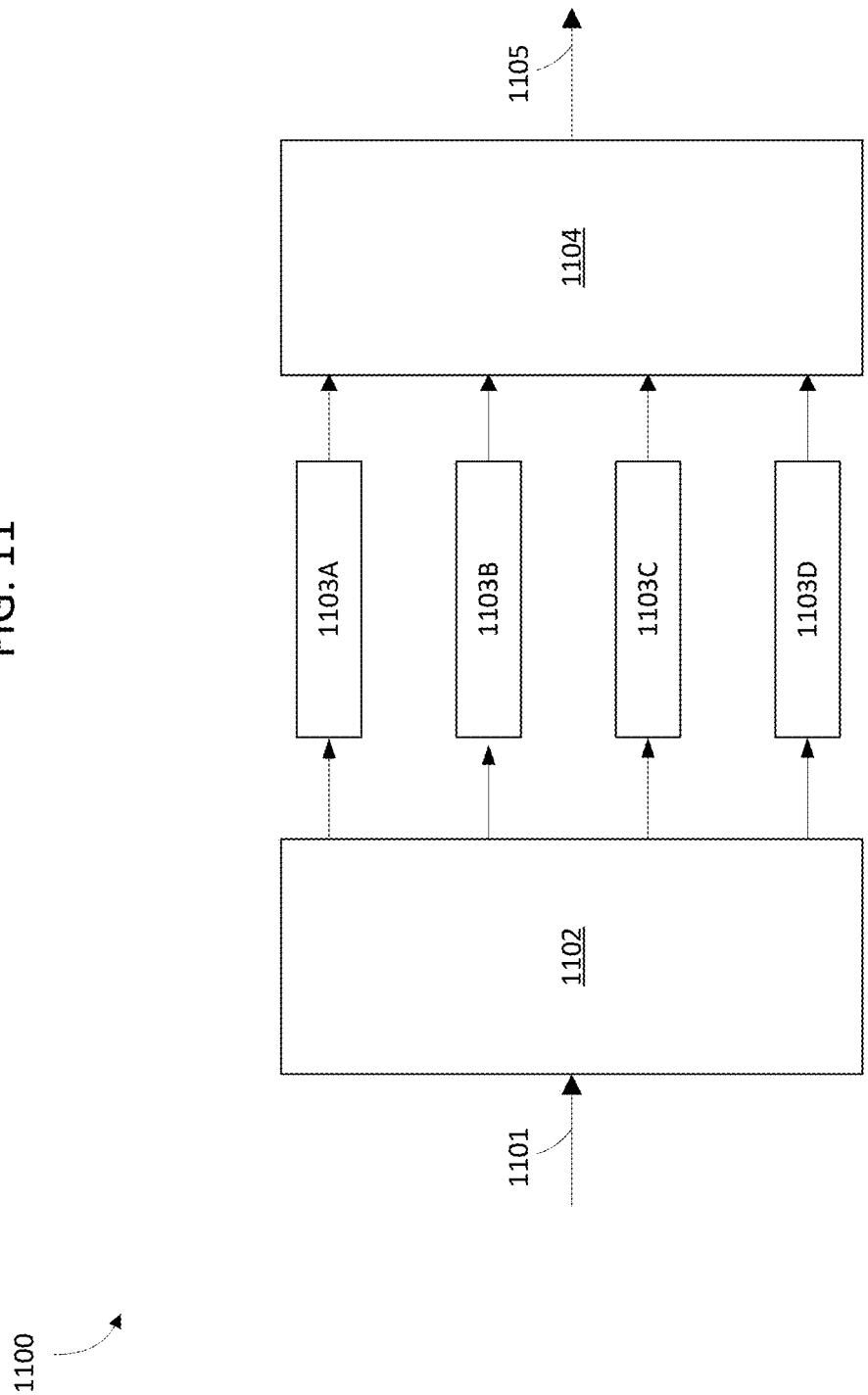
FIG. 11 illustrates an example unidirectional logical channel that comprises multiple photonic links.

The messages can be in the form of variably sized packets. FIG. 11 illustrates an example unidirectional logical channel 1100 that comprises multiple photonic links. Logical channel 1100 has an input link 1101, a transmit bonding engine 1102, photonic paths 1103A-D, a receive bonding engine 1104, and an output link 1105. The transmit bonding engine 1102 may split incoming data packets across active photonic links and add sequence information. Receive bonding engine 1104 reassembles the data packets using the sequence information. In the depicted example, data arrives at the receive bonding engine on four links.

Figure 12:
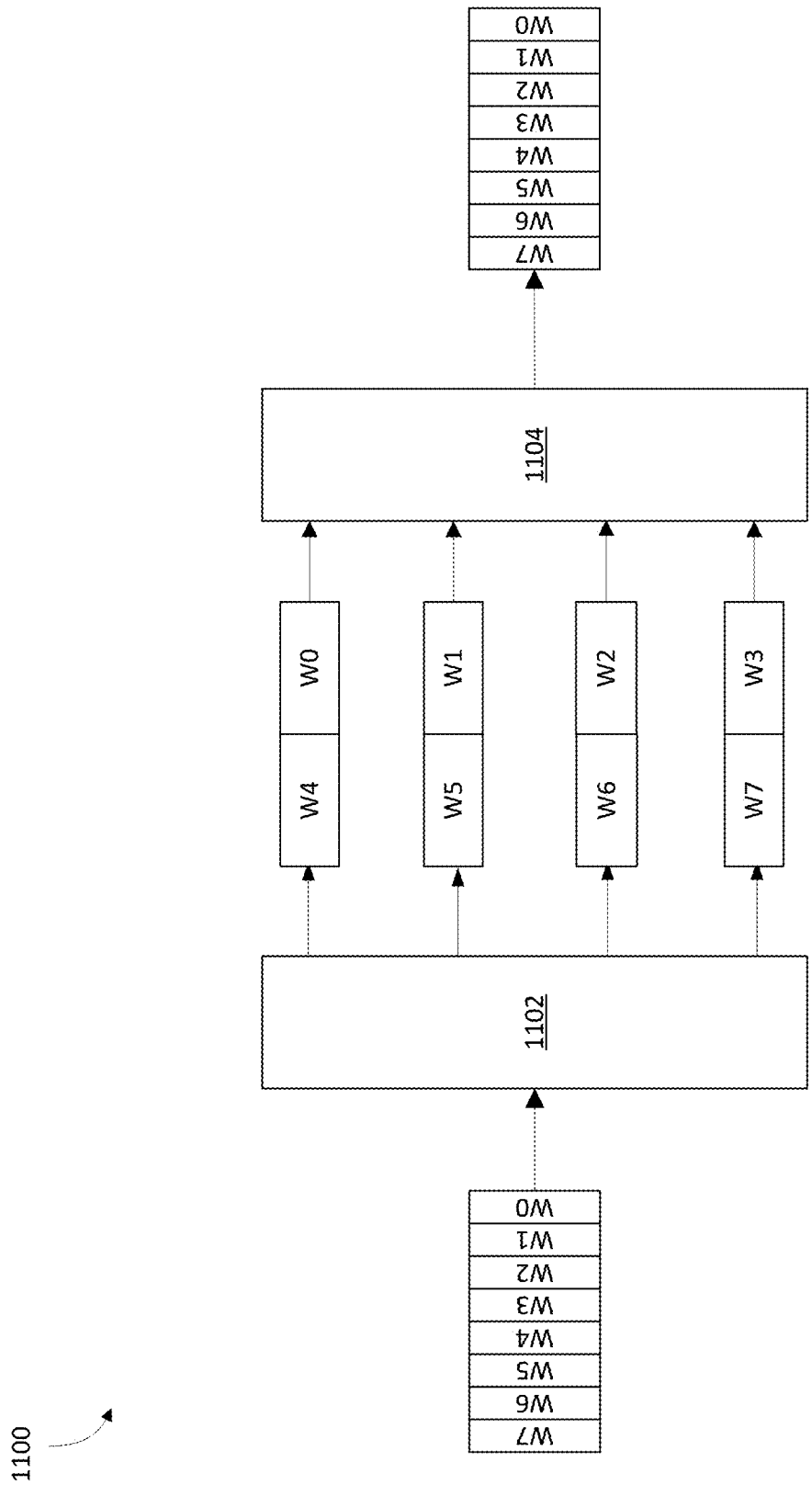
FIG. 12 illustrates transfer of an example message of eight words in the unidirectional logical channel of FIG. 11.

FIG. 12 illustrates transfer of an example message of eight words in the unidirectional logical channel 1100 of FIG. 11. The message comprises words W0-W7. Transmit bonding engine 1102 splits the words across four active photonic links. For example, a first link conveys words W0 and W4. A second link conveys words W1 and W5, and so on. Transmit bonding engine 1102 adds the sequence information to each of the partial messages and receive bonding engine 1104 reassembles the full message at its output. Bonding can allow construction of high-bandwidth, low-latency channels from multiple lower-bandwidth links, and may provide the ability to avoid non-working links.

Figure 13:
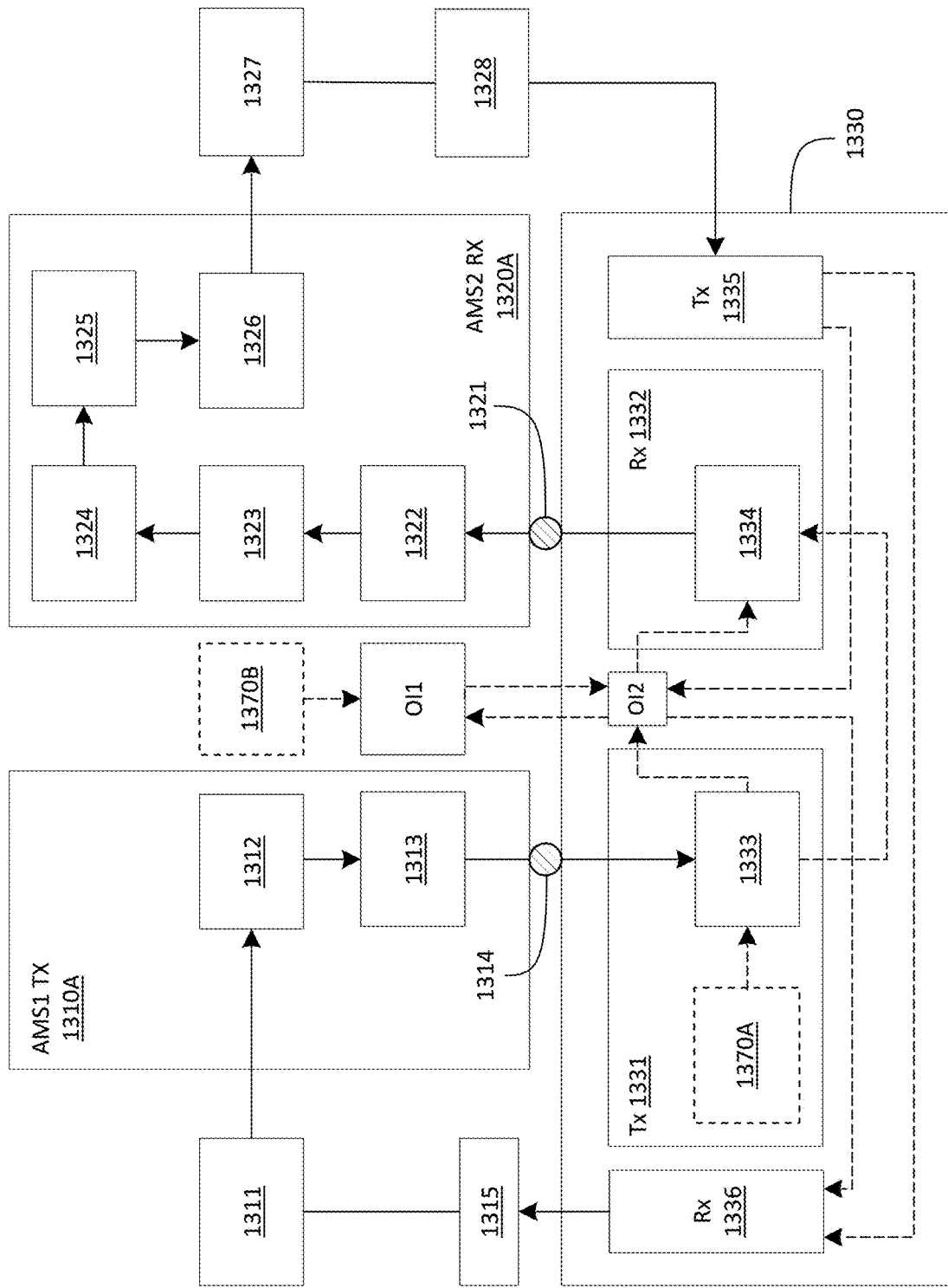
FIG. 13 shows example AMS blocks in more detail.

FIG. 13 shows example AMS blocks in more detail. FIG. 13 shows an AMS transmit block 1310A for a first die and an AMS receive block 1320A for a second die. The AMS receive block 1315 for the first die and the AMS transmit block 1328 for the second die are not detailed to simplify the diagram. Each of the AMS blocks 1310A and 1320A can be connected to OMIB 1330 via one or more electrical interconnects (here only interconnects 1314 for AMS transmit block 1310A and 1321 for AMS receive block 1320A are shown). As shown in FIG. 13, each link in a photonic channel comprises an optical transmit unit Tx, an optical receive unit Rx, and an optical transmission medium (e.g., an optical waveguide or fiber) connecting the transmit unit to the receive unit, in this case AMS transmit block 1310A is coupled with AMS receive block 1320A and AMS transmit block 1335 is coupled with AMS receive block 1336. The transmit unit (e.g., transmit unit 1331) includes an optical modulator (e.g., modulator 1333) that imparts a message onto an optical signal by modulating carrier light output by a light engine 1370, and an electrical serializer (e.g., serializer 1313) that converts an electronic message received in the form of parallel data words into a signal suitable for driving the optical modulator. The receive unit (e.g., receive unit 1332) includes a photodetector (e.g., photodetector 1334) to convert the optical signal received via the transmission medium back to an electrical signal, and associated electronics including a transimpedance amplifier (e.g., TIA 1322) and gain control (e.g., gain control 1323) to normalize the signal level, a slicer (e.g., slicer 1324) to extract the bit-stream, and a de-serializer (e.g., de-serializer 1325) to convert the received message back into parallel data. AMS transmit block 1310A further includes a transmit bonding engine 1312 that can split messages from first interface 1311 as detailed with reference to FIG. 11, and AMS receive block 1320A includes a receive bonding engine 1326 to reassemble messages for second interface 1327 as detailed with reference to FIG. 12. OMIB 1330 may further include a receive block 1336 interfacing with AMS receive block 1315; a transmit block 1335 interfacing with AMS transmit block 1328; a light engine 1370; an optical interface OI1; and an optical interface OI2.

In one implementation, information is modulated at 56 Gb/s in a non-return-to-zero (NRZ) code, but more spectrally efficient modulation schemes such as PAM-4 or PAM-8 or higher-order pulse amplitude modulation may be used to allow higher-bandwidth and lower-latency links.

Figure 14A:
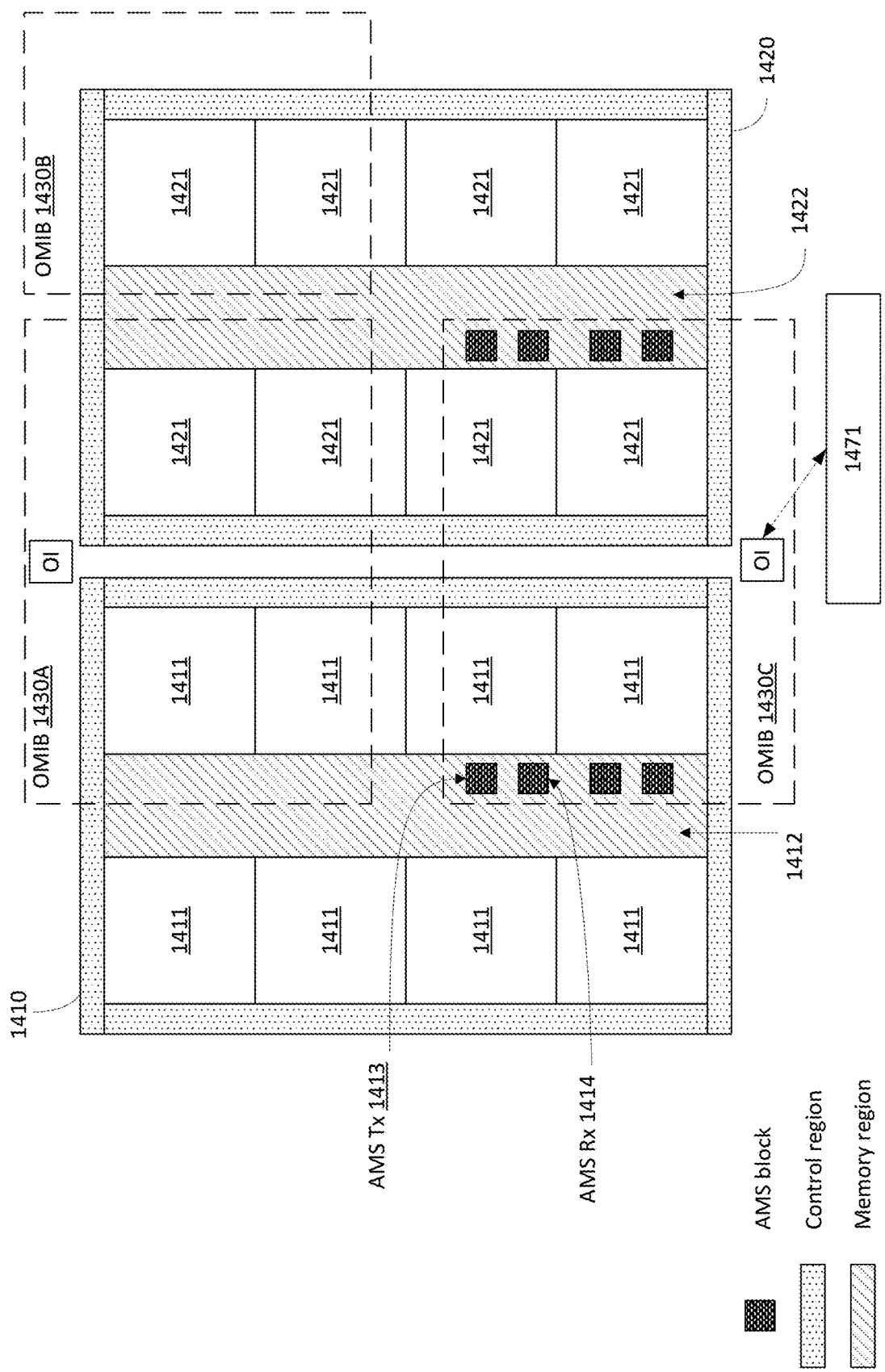
FIG. 14A shows an arrangement of three OMIBs bridging a portion of two dies.

FIG. 14A shows an arrangement of three OMIBs bridging a portion of two dies. OMIB 1430A bridges two compute elements 1411 in first die 1410, a first part of central region 1412 in first die 1410, two compute elements 1421 in second die 1420, and a first part of memory region 1422 in second die 1420. OMIB 1430B bridges two compute elements 1421 in second die 1420 and a second part of memory region 1422 in second die 1420. OMIB 1430C bridges two compute elements 1411 in first die 1410, a second part of central region 1412 in first die 1410, two compute elements 1421 in second die 1420, and a third part of memory region 1422 in second die 1420. Central region 1412 is located centrally in first die 1410 to even out latencies between the compute elements 1411 and central region 1412. Central region 1412 may include memory, cache memory, other shared memories, a network on-chip crossbar, a switch, a routing mechanism, and memory controllers. Memory region 1422 is located centrally in second die 1420 to even out latencies between the compute elements 1421 and memory region

1422. Memory region 1422 may include cache memory, other shared memories, and memory controllers. The portions of the dies that the OMIBs bridge have 10 compute elements and two memory regions. Additional OMIBs (not shown) could be positioned on an opposite side of first die 1410 and second die 1420 to bridge to additional dies, compute elements, and parts of the memory regions. The arrangement enables a packet to be routed photonically from an external device optical interface 1471 to an AMS block proximate to the memory that is being utilized or accessed and proximate to the location where the compute element 1411 or 1421 can perform one or more computations on the data in the memory region. The capability of an OMIB to carry instructions from an arbitrary compute element or external device, for example to load or store data in the memory regions 1422 and/or process the data with a compute element 1411 or 1421 that is proximate to the central region 1412 or the memory region 1422, using a packet that is carried as a photonic signal via the OMIB to the interior of one of the dies 1410 or 1420 addresses many of the problems of stranded memory and/or the latency introduced when an optical signal cannot extend beyond the edge of a die.

The AMS transmit and receive blocks can take an optical signal to the central region of either die (e.g., to a memory controller to access a memory in the central region) from any external device optical interface that is connected by an inter-OMIB link to the OMIB or from and AMS transmit and receive block that has an inter-OMIB connection within the bridge. The OI of each OMIB can also be connected by a fiber although this is not required. A first side of an AMS transmit block 1413 or an AMS receive block 1414 (e.g., the right side) is aligned with a first side (e.g., the right side) of the central region (e.g., central region 1412). The first side of the central region being proximate and/or touching a compute element 1411 such as a CPU, GPU, TPU and the like. A second side of the AMS transmit block 1413 or an AMS receive block 1414 (e.g., the left side) is aligned with the left side of the OMIB. The alignment of the sides is approximate and need not be exact but typically the alignment is in at least two dimensions to allow for abutment between optical and electrical elements in the OMIB and AMS blocks respectively.

Figure 14B:
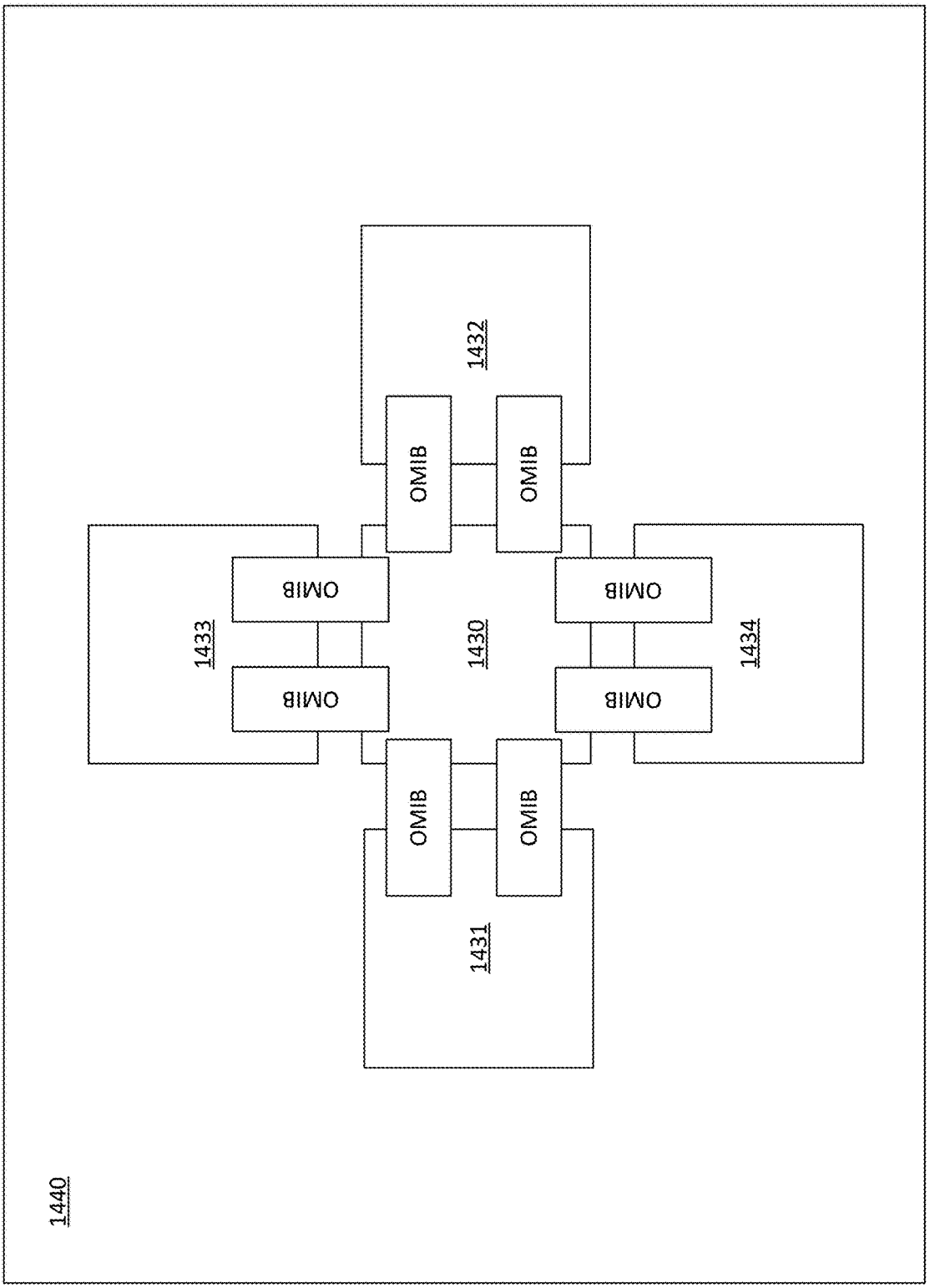
FIG. 14B shows an example arrangement of five dies being bridged by OMIBs.

FIG. 14B shows an example arrangement of five dies 1430-1434 being bridged by OMIBs. Using this arrangement of package 1440, bridges can be added indefinitely in two dimensions as needed. In this configuration, each OMIB has two interconnect regions for attaching dies. An L2 cache or other memory region can be positioned and/or fabricated at a central portion of the die such that the memory region can be reached photonically at the interior of the die (rather than the edge), which results in less latency. It is also possible to provide optical channels among OMIBs, for example by linking two OMIBs via an optical fiber. An OI can be positioned in the offset region of an OMIB. The arrangement of FIG. 14B can be extended indefinitely in the x and y directions. Moreover, the arrangement of FIG. 14B allows routing through multiple hops in a diagonal direction thereby significantly further reducing the routing latency.

Figure 14C:
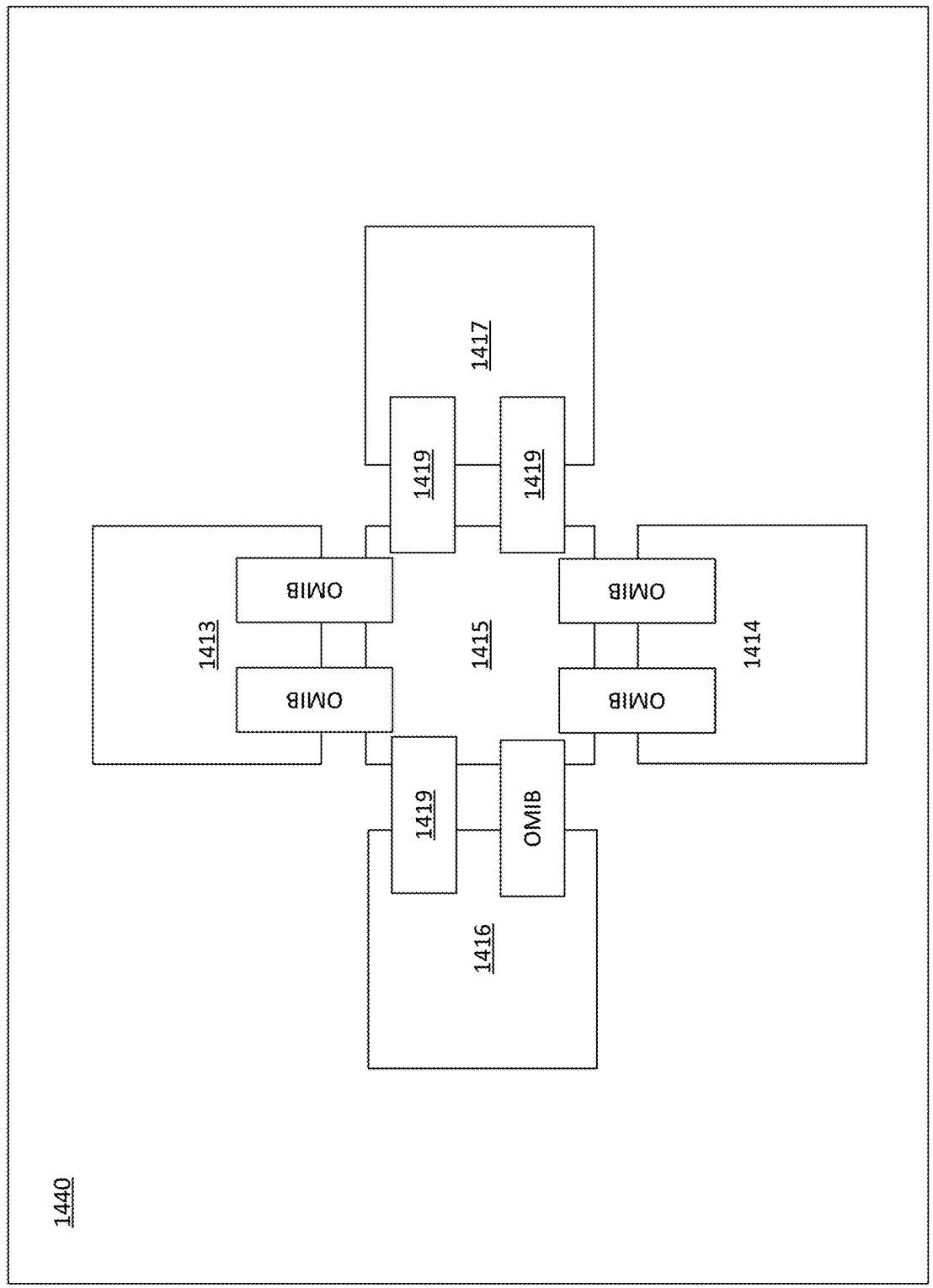
FIG. 14C shows an example arrangement of dies being bridged by both OMIBs and electrical bridges.

FIG. 14C shows an example arrangement of dies 1413-1417 being bridged by both OMIBs and electrical bridges 1419. In some implementations, an OMIB and an electrical bridge are combined in a single die.

As shown in the following, one OMIB can bridge four dies. For example, the OMIB is used to bridge dies both vertically and horizontally, which results in 4 interconnect regions on each OMIB to correspond to four AMS blocks on the respective dies. An OMIB in this arrangement may provide channels in six directions, including two horizontally, two vertically, and two diagonally.

Figure 14D:
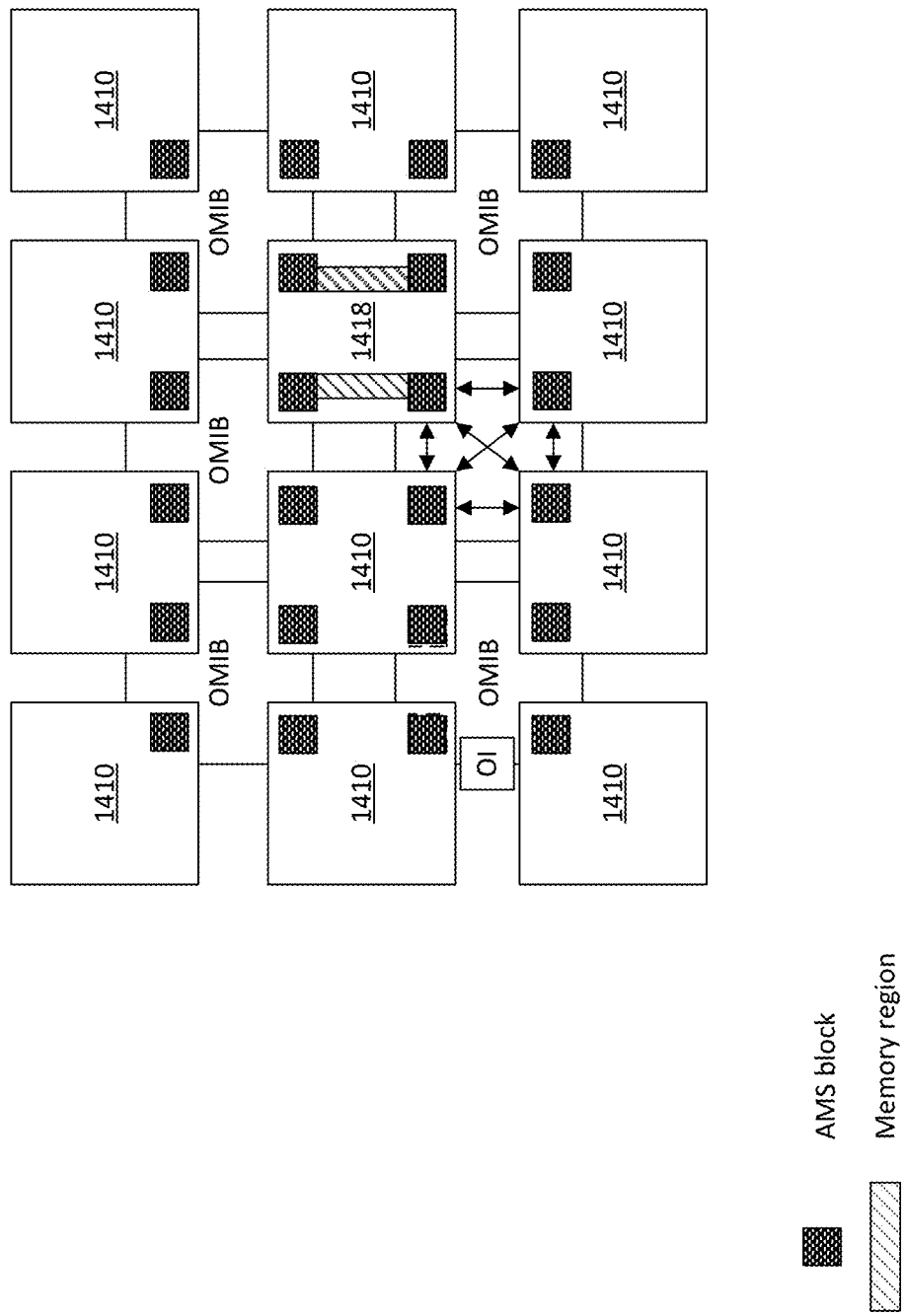
FIG. 14D shows an example offset checkerboard of OMIBs bridging dies in two dimensions.

FIG. 14D shows an example offset checkerboard of OMIBs bridging dies (1410, 1418) in two dimensions. Each OMIB has four interconnection regions and is capable of bridging four dies using six links (2 vertical, 2 horizontal, and 2 diagonal links), representing 6 intra-die connections on each OMIB. Some dies, e.g., die 1418, may include memory regions. AMS blocks can interface with the memory regions as well as with any processing elements and other logic. Note that FIG. 14D may not be to scale. OMIBs whose dimensions are similar to those of the dies being bridged can reach AMS blocks close to the center of the dies. Also, AMS blocks may be relatively much smaller than those shown in the example, and each die and each OMIB may have more than four interconnect regions.

FIG. 15 is a flowchart showing example method 1500 of fabricating an OMIB according to various implementations. Method 1500 comprises the following operations.

Operation 1510—fabricating a bridge including a photonic link from a first interconnect region to a second interconnect region, wherein the photonic link includes a first electrical interconnect, a modulator coupled with the first electrical interconnect, an optical transmission medium coupled with the modulator, a photodetector coupled with the optical transmission medium, and a second electrical interconnect. In some implementations, the modulator is configured to be temperature stabilized by applying a stabilization voltage to the modulator, wherein the stabilization voltage is related to a die temperature, and wherein the stabilization voltage induces a change in an electrical absorption in the modulator.

Operation 1520—positioning the interconnect regions to enable an electrical interconnect and/or abutted coupling to AMS blocks in the dies.

Operation 1530—fabricating an intra-OMIB connection between the interconnect regions.

Operation 1540—fabricating an inter-OMIB connection between the two interconnect regions and an optical interface.

Figure 16:
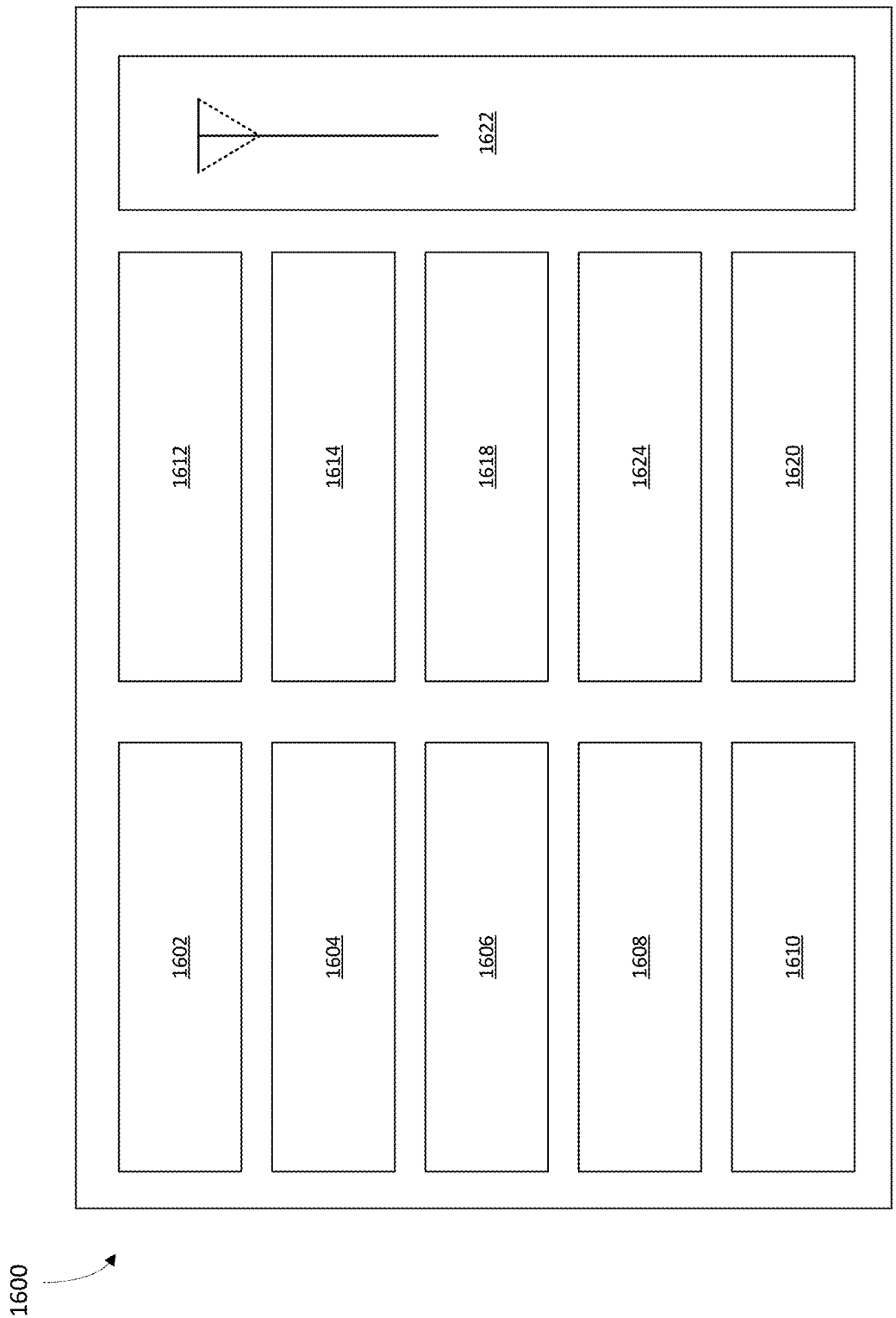
FIG. 16 illustrates components of an example system in which one or OMIBs may be used.

FIG. 16 illustrates components of an example system 1600 in which one or OMIBs may be used. Each of the components, or group of components, may include AMS blocks and interfaces to couple with one or more OMIBs. For example, the system 1600 may include display device interface circuitry like connectors and drivers to which a display device 1606 may be coupled. In this case it is not necessary for a display device 1606 to be integrated into or be a component of the system 1600. Similarly, the system 1600 may not have an audio input device 1624 or an audio output device 1608 but may have audio input or output device interface circuitry, such as connectors and supporting circuitry, for coupling to an external audio input device or external audio output device.

System 1600 may include one or more processing devices 1602. Processing device 1602 may include one or more digital signal processors (DSPs), application-specific integrated circuits (ASICs), central processing units (CPUs), graphics processing units (GPUs), tensor processing units (TPUs), AI accelerators, fixed-gate programmable arrays (FPGAs), load/store units (LDSUs), neural compute engines (NCEs), dot-product and/or convolution engines, server processors, or any other suitable processing devices. System 1600 may include a memory 1604, which may itself include one or more memory devices such as volatile memory, nonvolatile memory, flash memory, solid state memory, and/or a hard drive, including but not limited to: a random-access memory (RAM) device, (such as static RAM (SRAM) device, a magnetic RAM (MRAM) device, a resistive RAM (RRAM) device, or a conductive-bridging RAM (CBRAM) device), a logic device (e.g., an AND, OR, NAND, or NOR gate), A NAND Flash memory, a solid-state drive (SSD) memory, a NOR Flash memory, a CMOS memory, a thin film transistor-based memory, a phase change memory (PCM), a storage class memory (SCM), a magneto-resistive memory (MRAM), a resistive RAM, a DRAM, a high bandwidth memory (HBM), a DDR-based DRAM, a DIMM memory. In some implementations, the memory 1604 may include memory that shares a die with the processing device 1602. This memory may be used as cache memory and may include embedded dynamic RAM or spin transfer torque magnetic RAM.

In some implementations, system 1600 may include a communication chip 1612. For example, communication chip 1612 may be configured for managing wireless communications for the transfer of data to and from the device.

Communication chip 1612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), and others). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1612 may operate in accordance with other wireless protocols in other implementations. System 1600 may include an antenna 1622 to facilitate wireless communications and/or to receive other wireless communications (such as AM or FM radio transmissions).

In some implementations, communication chip 1612 may manage wired communications, such as electrical, optical, or any other suitable communication protocols (e.g., the Ethernet or USB). As noted above, the communication chip 1612 may include multiple communication chips. For instance, a first communication chip 1612 may be dedicated to shorter range wireless communications such as Wi-Fi or Bluetooth, and a second communication chip 1612 may be dedicated to longer-range wireless communications such as EDGE, GPRS, CDMA, WiMAX, LTE, EV-DO, or others. In some implementations, a first communication chip 1612 may be dedicated to wireless communications, and a second communication chip 1612 may be dedicated to wired communications.

System 1600 may include battery/power circuitry 1614. The battery power circuitry 1614 may include one or more energy storage devices (e.g., batteries or capacitors) and/or circuitry for coupling components of system 1600 to an external energy source (e.g., AC line power). System 1600 may include a display device 1606 (or corresponding interface circuitry, as discussed above). The display device 1606 may include any visual indicators, such as a heads-up display, a computer monitor, a projector, a touchscreen display, a liquid crystal display (LCD), a light-emitting diode display, a flat panel display, a virtual reality headset, an augmented reality headset, etc. System 1600 may include an audio output device 1608 (or corresponding interface circuitry, as discussed above). The audio output device 1608 may include any device that generates an audible indicator, such as speakers, headsets, earbuds, vibration elements, piezo crystals, etc. System 1600 may include an audio input device 1624 (or corresponding interface circuitry, as discussed above). The audio input device 1624 may include any device that generates a signal representative of a sound, such as microphones, microphone arrays, or digital instruments (e.g., instruments having a pickup or a musical instrument digital interface (MIDI) output).

System 1600 may include a positioning device 1618 (or corresponding interface circuitry), such as according to the global positioning system (GPS), Galileo, GLONASS, BeiDou, IRNSS, NavIC, and/or QZSS. The positioning device 1618 may be in communication with a satellite-based system and may receive a location of system 1600, as known in the art. System 1600 may include another output device 1610 (or corresponding interface circuitry, as discussed above). Examples of the other output device 1610 may include an audio codec, a video codec, a printer, a wired or wireless transmitter for providing information to other devices, or an additional storage device. System 1600 may include another input device 1620 (or corresponding interface circuitry, as discussed above). Examples of another input device 1620 include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

System 1600 may have any desired form factor, such as a handheld or mobile device (e.g., a cell phone, a smartphone, a tablet computer, a laptop computer, an Internet-of-Things (IoT) device, a netbook computer, an ultrabook computer, a mobile internet device, a music player, a personal digital assistant (PDA), an ultra-mobile personal computer, and others), a desktop electrical device, a server device or other networked computing component, a printer, a scanner, a monitor, a settop box, an entertainment control unit, a vehicle control unit, a digital camera, a digital video recorder, or a wearable electrical device. In some implementations, system 1600 may be any other electronic device that processes data.

Thermal Behavior

The close spacing and abutment of an EIC and a PIC chiplet (less than 2 millimeters and often within 50 microns) creates a thermal challenge for an OMIB. Depending on the type of modulators used, the temperature range for operation within specifications may be less than thirty degrees Celsius. However, the die temperature of an EIC can vary significantly more, dependent on the ambient temperature, load conditions, supply voltage, and other factors. Modulator types include Mach-Zehnder interferometer (MZI), ring modulator, and electro-absorption modulator (EAM). Ring modulators have a very narrow temperature range (less than one degree Celsius), whereas MZI and EAM may have an operating range of more than thirty degrees Celsius. Both the modulator temperature and bias voltage may affect the frequency (wavelength) at which the modulator's efficiency peaks. The laser's wavelength may be unaffected, or differently affected, by these parameters. Thus, a change in temperature will result in a difference between the laser wavelength and the modulator's efficiency peak wavelength, thus affecting the modulation depth.

Implementations may include modulators that are inherently optimal over a desired temperature range. Alternatively, an implementation may provide temperature compensation including a temperature sensing or predicting capability. The temperature compensation may be fully incorporated in the OMIB, or partially in the OMIB and partially in a connecting die.

Figure 17B:
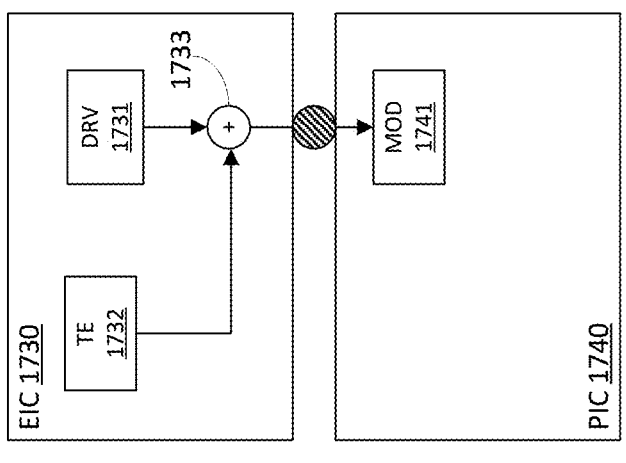
FIGS. 17A-17D illustrate examples of EIC/OMIB combinations that employ temperature compensation to widen the temperature range of the modulators in the OMIB.
Figure 17A:
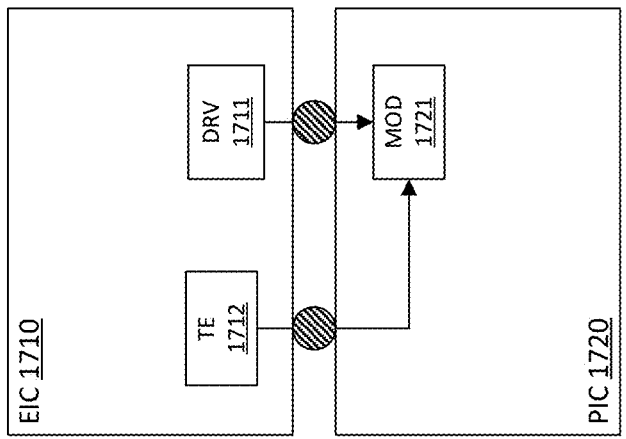

FIGS. 17A-D illustrate examples of EIC/OMIB combinations that employ temperature compensation to widen the temperature range of the modulators in the OMIB. FIG. 17A shows an EIC 1710, physically and electrically coupled with a PIC 1720 (e.g., an OMIB) via metal interconnects such as bumps or copper pillars. EIC 1710 includes a driver DRV 1711, and a temperature element TE 1712. TE 1712 may include a temperature sensor, a temperature predictor, or both (a temperature predictor predicts die or PIC temperature based on a processor's load conditions known in its software or firmware). In some implementations, the temperature sensor is located less than two millimeters (2 mm) from DRV 1711. In further implementations, the temperature sensor is located less than fifty micron (50 µm) from DRV 1711. Driver DRV 1711 delivers a high-data rate modulation signal to modulator 1721 in PIC 1720. TE 1712 delivers a low-frequency (compared to the data rate) temperature-dependent bias voltage to MOD 1721. If the temperature dependency of the bias voltage inversely matches that of the modulator over an extended temperature range, it will cancel the effects of the temperature on the modulator performance in the extended temperature range. In further implementations, TE 1712 includes a lookup table to translate the measured or predicted temperature to a temperature-compensating modulator bias voltage.

In FIG. 17B, EIC 1730 is physically and electrically coupled with PIC 1740 (e.g., an OMIB). EIC 1730 includes driver DRV 1731, temperature element TE 1732, and adder 1733. PIC 1740 includes modulator MOD 1741. Adder 1733 adds the low-frequency temperature-dependent bias voltage from TE 1732 to the high-data rate modulation signal from DRV 1731, and forwards it to MOD 1741. In some implementations, TE 1732 includes a lookup table to translate the measured or predicted temperature to a temperature-compensating modulator bias voltage.

Figure 17D:
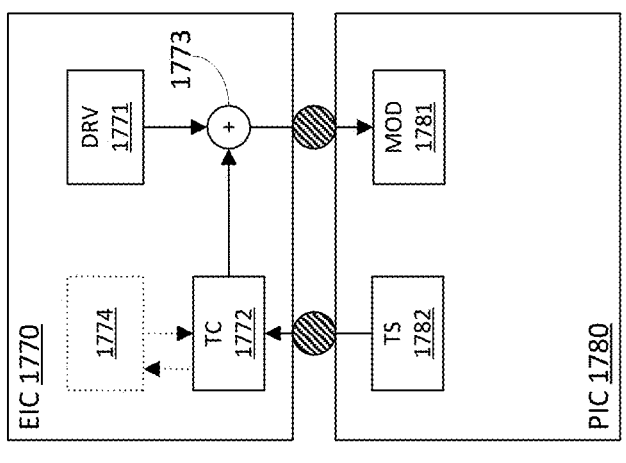
Figure 17C:
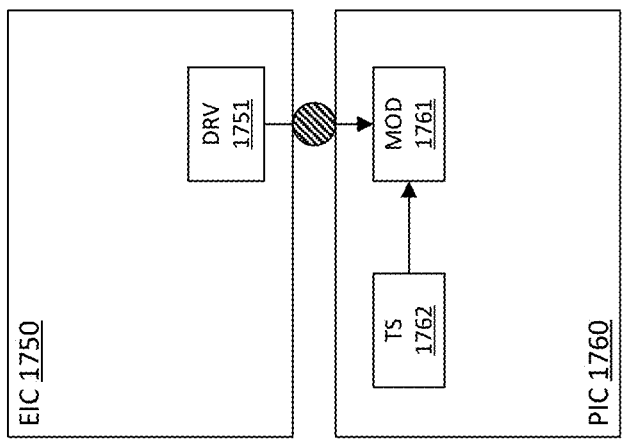

In FIG. 17C, EIC 1750 is physically and electrically coupled with PIC 1760 (e.g., an OMIB). EIC 1750 includes driver 1751, whereas PIC 1760 (e.g., an OMIB) includes modulator MOD 1761 and temperature sensor TS 1762. TS 1762 is located close to MOD 1761, and delivers a temperature-dependent bias voltage to MOD 1761. The temperature dependency of the bias voltage inversely matches that of the MOD 1761 over an extended temperature range, extending its operating temperature range.

In FIG. 17D, EIC 1770 is physically and electrically coupled with PIC 1780 (e.g., an OMIB). PIC 1780 includes modulator MOD 1781 and temperature sensor TS 1782. TS has a temperature sensor output configured to be coupled with a circuit external to PIC 1780 (e.g., EIC 1770). EIC 1770 includes driver DRV 1771, temperature controller TC 1772, and adder 1773. TC 1772 is configured to receive a first temperature-dependent signal from a circuit external to EIC 1770 (e.g., from TS 1782 in PIC 1780). TC 1772 converts the first temperature-dependent signal to a temperature-dependent bias voltage, whose temperature dependency inversely matches that of the MOD 1781 over an extended temperature range. TC 1772 may perform the conversion using temperature-linear and temperature-nonlinear analog circuits. Alternatively, or additionally, TC 1772 may perform the conversion using digital circuits to access a memory 1774 that stores a temperature profile. TC 1772 may be included in in temperature element TE, such as TE 1732 in FIG. 17B. In some implementations, TC 1772 includes a lookup table to translate the measured or predicted temperature to a temperature-compensating modulator bias voltage.

Some modulators can provide stable operation over a wide temperature range of modulation for optical components, for example when incorporated into an OMIB, even without the addition of temperature compensation. Modulators may utilize the Franz-Keldysh effect for electrically-induced changes in optical absorption. A variety of materials may be used in the modulators, including germanium and its alloys, silicon and its alloys, III-V materials, such as those based on indium phosphide (InP) or gallium arsenide (GaAs) material systems. For example, one or more implementations described herein involve chip hardware including features and functionality that provide a thermally stable optical modulation element(s) coupled to electronic element(s) (e.g., a driver in an AMS transmit block). In one or more implementations, the hardware is an apparatus that includes an electronic-integrated circuit (EIC) and a photonic-integrated circuit (PIC). The PIC may be electrically interconnected in a coupling or an abutted coupling with the EIC. Each of the transmit units may include a thermally-stable optical modulator in a portion that resides in the PIC. The data may be moved optically in the PIC via an optical carrier between one of the thermally stable optical modulators in a first portion of the OMIB and one of the receive units in or interconnected with a second portion of the OMIB. In one or more implementations, a thermally stable optical modulator operates in a temperature range larger than thirty degrees Celsius. In this example, the thermally stable optical modulator may further include materials selected from a group including of germanium, silicon, an alloy of germanium, an alloy of silicon, a III-V material based on indium phosphide (InP), and a III-V material based on gallium arsenide (GaAs). In one or more implementations, the optical modulator is an electro-absorption modulator (EAM) which uses the Franz-Keldysh effect for an electrically induced charge in an optical absorption.

In one or more implementations, the thermally stable optical modulator is an EAM that operates in a temperature range smaller than thirty degrees Celsius. In this example, the thermally stable optical modulator may include (e.g., include of) materials selected from a group including germanium, silicon, an alloy of germanium, an alloy of silicon, a III-V material based on indium phosphide (InP), and a III-V material based on gallium arsenide (GaAs). In one or more implementations, the thermally stable optical modulator uses a quantum-confined stark effect (QCSE) for an electrically induced change in an optical absorption. In one or more implementations, the thermally stable optical modulator has an output that has a high optical modulation amplitude. In this example, the thermally stable optical modulator may include materials selected from a group including germanium, silicon, an alloy of germanium, an alloy of silicon, a III-V material based on indium phosphide (InP), and a III-V material based on gallium arsenide (GaAs). In one or more implementations, the thermally stable optical modulator uses a quantum confined stark effect (QCSE) for an electrically induced change in an optical absorption. In one or more implementations, the thermally stable optical modulator is configured for stable operation over a wide temperature range. In this example, the thermally stable optical modulator may include materials selected from the group including of germanium, silicon, an alloy of germanium, an alloy of silicon, a III-V material based on Indium Phosphide (InP), and a III-V material based on gallium arsenide (GaAs). In one or more implementations, the modulator uses a Franz-Keldysh effect for an electrically induced change in an optical absorption.

Fabrication

FIG. 18 illustrates an example method 1800 of fabricating a system. Method 1800 comprises Step 1810 which includes fabricating a system that includes a first die (integrated circuit), a second die (integrated circuit), a photonic IC that provides a bridge function, a light source, and a data channel. The photonic IC includes a first interconnect region, a second interconnect region, and an offset region. A bondpad pattern on the first integrated circuit matches a bondpad pattern in the first interconnect region, and a bondpad pattern on the second integrated circuit matches a bondpad pattern in the second interconnect region. Two or more bondpads on the first integrated circuit are physically and electrically coupled with two or more bondpads in the first interconnect region, and two or more bondpads on the second integrated circuit are physically and electrically coupled with two or more bondpads in the second interconnect region. The light source is optically coupled with a first optical interface (a first OI) in the offset region. The data channel comprises a serializer and a driver in the first integrated circuit, a modulator, photonic path, and photodetector in the photonic IC, a transimpedance amplifier and a deserializer in the second integrated circuit. The distance between the surface of the first integrated circuit and the surface of the photonic IC is less than 2 mm, and the distance between the surface of the second integrated circuit and the surface of the photonic IC is less than 2 mm. In many cases, the distances are less than 50 microns (50 µm). At least one of the two or more bondpads on the first integrated circuit may be located more than 100 microns (100 µm) from the edge of the first integrated circuit. At least one of the two or more bondpads on the second integrated circuit may be located more than 100 microns (100 µm) from the edge of the second integrated circuit. The modulator can be an electro-absorption modulator (EAM). The modulator can be a Mach-Zehnder Interferometer (MZI). The first die or the photonic IC may include a temperature sensor or a temperature predictor that can deliver a temperature-dependent bias signal.

Considerations

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

For example, many examples in this document couple a fiber to a photonics IC using a grating coupler. However, many of the implementations work well using other means for optical interfacing between a fiber and a photonic IC, such as described with reference to FIG. 3. Although many examples show only an OMIB bridging a first die and a second die, an OMIB may bridge any number of dies. Although most examples show the AMS functions included in the first die and/or second die, the AMS functions may be partially or fully included in separately stacked ICs, such as shown in FIGS. 5D-E. All such implementations are within the scope and ambit of the disclosed technology.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, a coarse-grained reconfigurable architecture (CGRA), or in a programmable logic device such as a field-programmable gate array (FPGA), obviating the need for at least part of any dedicated hardware. Implementations may be as a single chip, or as a multi-chip module (MCM) packaging multiple semiconductor dies in a single package. All such variations and modifications are to be considered within the ambit of the disclosed technology the nature of which is to be determined from the foregoing description.

Any suitable technology for manufacturing electronic devices can be used to implement the circuits of particular implementations, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular implementations. In some particular implementations, multiple elements, devices, or circuits shown as sequential in this specification can be operating in parallel.

Particular implementations may be implemented by using a programmed general-purpose digital computer, application-specific integrated circuits, programmable logic devices, field-programmable gate arrays, optical, chemical, biological, quantum or nanoengineered systems, etc. Other components and mechanisms may be used. In general, the functions of particular implementations can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

What is claimed is:

1. A bridge comprising:
   a plurality of interfaces comprising four interfaces, wherein:
      each interface is an electrical interface configured to connect electrically a respective die to the bridge,
      each interface includes a serializer and deserializer for any die connected to the bridge through the interface; and
   a photonic network, wherein:
      the photonic network includes a directional photonic link from the serializer of each of the four interfaces to the deserializer of each of the remaining three interfaces, whereby the photonic network and the interfaces provide six bidirectional photonic communication paths ending at the four interfaces and every interface of the four interfaces is bidirectionally coupled to every other of the four interfaces.

2. The bridge of claim 1, wherein the four interfaces are arranged in two dimensions, and the six communication paths are two horizontal paths, two vertical paths, and two diagonal paths.

3. The bridge of claim 1, wherein each of the four interfaces comprises a respective analog/mixed signal (AMS) block that comprises the serializer and deserializer of the interface.

4. The bridge of claim 1, wherein the photonic links of the photonic network are implemented in a bridge substrate.

5. The bridge of claim 4, wherein the bridge substrate is an integrated circuit.

6. The bridge of claim 5, wherein each AMS block is disposed on the bridge substrate.

7. The bridge of claim 1, further comprising an optical interface coupled to the photonic network.

8. The bridge of claim 1, further comprising four dies each connected to the bridge through a respective interface, wherein the four dies include at least one die with a memory region.

9. The bridge of claim 8, wherein the four dies each are rectangular and are laterally or diagonally adjacent to each other.

10. The bridge of claim 8, wherein the four dies are each electrically coupled to the bridge.

11. The bridge of claim 3, wherein the four dies are each electrically connected to respective AMS blocks through electrical paths in the bridge.

12. The bridge of claim 4, wherein the four interfaces are arranged in two dimensions, and the six communication paths are two horizontal paths, two vertical paths, and two diagonal paths.

13. The bridge of claim 4, wherein each of the four interface comprises a respective analog/mixed signal (AMS) block that comprises the serializer and deserializer of the interface.

14. The bridge of claim 4, wherein the photonic links of the photonic network are implemented in a bridge substrate.

15. The bridge of claim 5, wherein the four interfaces are arranged in two dimensions, and the six communication paths are two horizontal paths, two vertical paths, and two diagonal paths.

16. The bridge of claim 5, wherein each of the four interfaces comprises a respective analog/mixed signal (AMS) block that comprises the serializer and deserializer of the interface.

17. The bridge of claim 5, wherein the photonic links of the photonic network are implemented in a bridge substrate comprising an integrated circuit.

18. The bridge of claim 8, wherein the four interfaces are arranged in two dimensions, and the six communication paths are two horizontal paths, two vertical paths, and two diagonal paths.

19. The bridge of claim 8, wherein each of the four interface comprises a respective analog/mixed signal (AMS) block that comprises the serializer and deserializer of the interface.

20. The bridge of claim 8, wherein the photonic links of the photonic network are implemented in a bridge substrate comprising an integrated circuit.

21. The bridge of claim 8, further comprising an optical interface coupled to the photonic network.

* * * * *